(12) United States Patent
Kim et al.

(10) Patent No.: US 10,020,318 B2
(45) Date of Patent: Jul. 10, 2018

(54) SEMICONDUCTOR DEVICE

(71) Applicant: SAMSUNG ELECTRONICS CO., LTD., Suwon-si, Gyeonggi-do (KR)

(72) Inventors: Jung Ho Kim, Seongnam-si (KR); BiO Kim, Seoul (KR); Hyung Joon Kim, Yongin-si (KR); Young Seon Son, Hwaseong-si (KR); Su Jin Shin, Osan-si (KR); Jae Young Ahn, Seongnam-si (KR); Ju Mi Yun, Pocheon-si (KR); HanMei Choi, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 46 days.

(21) Appl. No.: 15/218,610

(22) Filed: Jul. 25, 2016

(65) Prior Publication Data

US 2017/0077136 A1    Mar. 16, 2017

(30) Foreign Application Priority Data

Sep. 10, 2015    (KR) .................. 10-2015-0128353

(51) Int. Cl.
| | | |
|---|---|---|
| *H01L 29/792* | (2006.01) | |
| *H01L 27/11582* | (2017.01) | |
| *H01L 27/11565* | (2017.01) | |
| *H01L 27/11568* | (2017.01) | |

(52) U.S. Cl.
CPC .. *H01L 27/11582* (2013.01); *H01L 27/11565* (2013.01); *H01L 27/11568* (2013.01)

(58) Field of Classification Search
CPC .............................. H01L 27/115; H01L 29/792
USPC .................................................. 257/320–326
See application file for complete search history.

(56) References Cited

U.S. PATENT DOCUMENTS

| | | |
|---|---|---|
| 8,008,722 B2 | 8/2011 | Kim et al. |
| 8,461,003 B2 | 6/2013 | Joo et al. |
| 8,519,471 B2 | 8/2013 | Kuk et al. |
| 8,581,321 B2 | 11/2013 | Son et al. |
| 8,877,590 B1 | 11/2014 | Lee |
| 8,928,061 B2 | 1/2015 | Chien et al. |
| 2002/0154556 A1* | 10/2002 | Endoh .................. H01L 27/115 365/200 |
| 2014/0084357 A1 | 3/2014 | Choi et al. |
| 2015/0194435 A1* | 7/2015 | Lee .................. H01L 27/11575 257/329 |

FOREIGN PATENT DOCUMENTS

| | | |
|---|---|---|
| JP | 2011-199194 A | 10/2011 |
| KR | 10-2011-0001594 A | 1/2011 |
| KR | 10-2011-0001595 A | 1/2011 |

* cited by examiner

*Primary Examiner* — Marvin Payen
(74) *Attorney, Agent, or Firm* — Lee & Morse, P.C.

(57) ABSTRACT

A semiconductor device includes gate electrodes vertically stacked on a substrate, and channel holes passing through the gate electrodes to extend perpendicularly to the substrate and including a gate dielectric layer and a channel area. The gate dielectric layer may be formed of a plurality of layers, and at least one layer among the plurality of layers may have different thicknesses in different locations.

19 Claims, 23 Drawing Sheets

SEMICONDUCTOR DEVICE

CROSS-REFERENCE TO RELATED APPLICATION

Korean Patent Application No. 10-2015-0128353, filed on Sep. 10, 2015, in the Korean Intellectual Property Office, and entitled: "Semiconductor Device," is incorporated by reference herein in its entirety.

BACKGROUND

1. Field

Embodiments relate to a semiconductor device and a method of fabricating the same.

2. Description of the Related Art

Semiconductor devices have gradually been reduced in size while simultaneously being required to be able to process high capacity data. Accordingly, a degree of integration of semiconductor devices used in such electronic apparatuses has increased. For example, semiconductor devices having vertical transistor structures instead of planar transistor structures have been introduced to implement high integration.

SUMMARY

Embodiments are directed to a semiconductor device, including gate electrodes vertically stacked on a substrate, and channel holes passing through the gate electrodes to extend perpendicularly to the substrate and including a gate dielectric layer and a channel area. The gate dielectric layer may be formed of a plurality of layers, and at least one layer among the plurality of layers has different thicknesses in different locations.

Embodiments are also directed to a semiconductor device, including gate electrodes vertically stacked on a substrate, and channel holes passing through the gate electrodes to extend perpendicularly to the substrate and including a plurality of layers. An outer circumference and an inner circumference of at least one layer among the plurality of layers may have different shapes, and the inner circumference may have greater circularity than the outer circumference.

Embodiments are also directed to a semiconductor device, including a substrate having a plurality of transistors stacked substantially vertically with respect to the substrate and sharing a single channel structure, the channel structure being oriented substantially vertically with respect to the substrate, the plurality of transistors including a plurality of gate electrodes, a dielectric area that extends through each of the plurality of gate electrodes, the dielectric area having an outer circumference and an inner circumference, the outer circumference of the dielectric area having a different shape than the inner circumference of the dielectric area, and the inner circumference of the dielectric area being only convex relative to a vertical axis of the channel structure, and a channel area that extends through each of the plurality of gate electrodes, the channel area being surrounded by the dielectric area, an outer circumference of the channel area being only convex relative to the vertical axis.

BRIEF DESCRIPTION OF THE DRAWINGS

Features will become apparent to those of skill in the art by describing in detail example embodiments with reference to the attached drawings in which.

DETAILED DESCRIPTION

Figure 1:
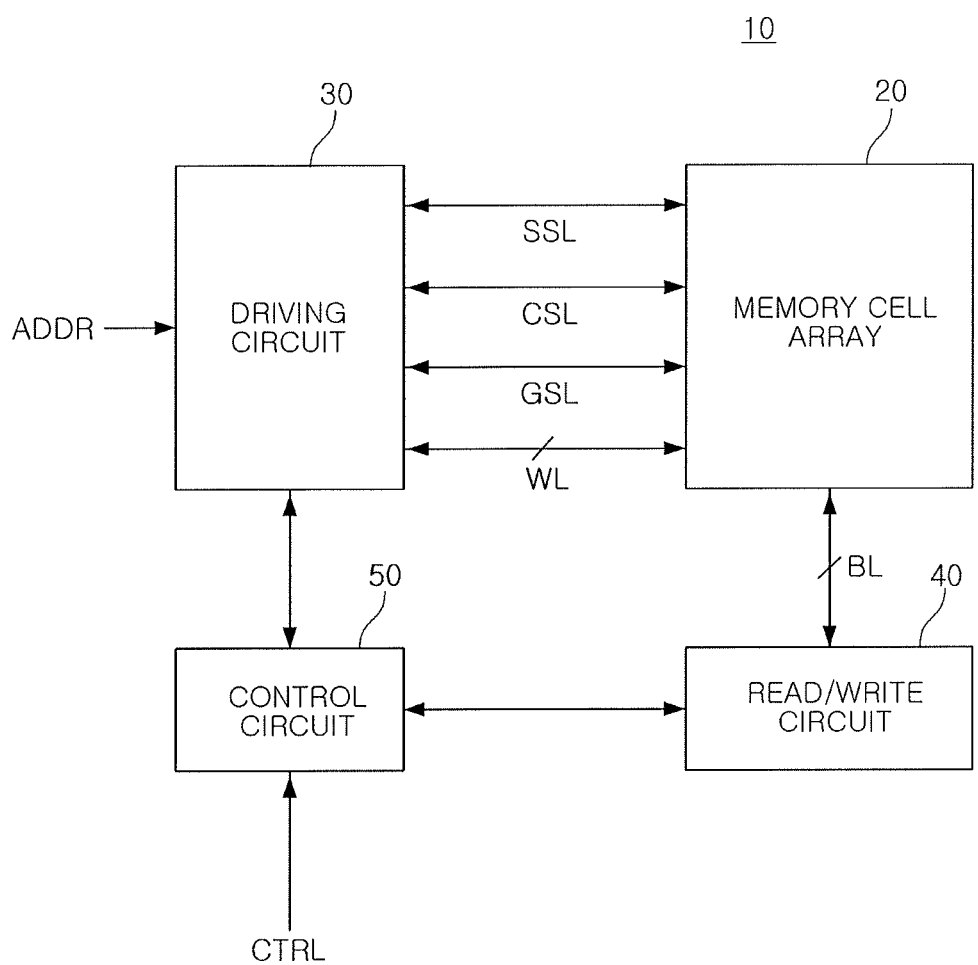
FIG. 1 illustrates a schematic block diagram of a semiconductor device according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art.

In the drawing figures, the dimensions of layers and regions may be exaggerated for clarity of illustration. Like reference numerals refer to like elements throughout.

Throughout the specification, it will be understood that when an element, such as a layer, region or wafer (substrate), is referred to as being "on," "connected to," or "coupled to" another element, it can be directly "on," "connected to," or "coupled to" the other element, or other elements intervening therebetween may be present. In contrast, when an element is referred to as being "directly on," "directly connected to," or "directly coupled to" another element, there may be no elements or layers intervening therebetween. As used herein, the term "and/or" includes any and all combinations of one or more of the associated listed items.

It will be apparent that though the terms first, second, third, etc., may be used herein to describe various members, components, regions, layers, and/or sections, these members, components, regions, layers, and/or sections should not be limited by these terms. These terms are only used to distinguish one member, component, region, layer, or section from another member, component, region, layer, or section. Thus, a first member, component, region, layer, or section discussed below could be termed a second member, component, region, layer, or section without departing from the teachings of the example embodiments.

Spatially relative terms, such as "above," "upper," "below," "lower," and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

As used herein, the singular forms "a," "an," and "the" are intended to include the plural forms as well, unless the context clearly indicates otherwise. It will be further understood that the terms "comprises," and/or "comprising" specify the presence of stated features, integers, steps, operations, members, elements, and/or groups thereof, but do not preclude the presence or addition of one or more other features, integers, steps, operations, members, elements, and/or groups thereof.

In the drawings, for example, due to manufacturing techniques and/or tolerances, modifications of the shape shown may be expected. Thus, embodiments should not be construed as being limited to the particular shapes of regions shown herein.

FIG. 1 is a schematic block diagram of a semiconductor device according to an example embodiment.

Referring to FIG. 1, a semiconductor device 10 according to the present example embodiment may include a memory cell array 20, a driving circuit 30, a read/write circuit 40, and a control circuit 50.

The memory cell array 20 may include a plurality of memory cells, and the plurality of memory cells may be arranged in a plurality of rows and columns. The plurality of memory cells included in the memory cell array 20 may be connected to the driving circuit 30 via a word line WL, a common source line CSL, a string select line SSL, a ground select line GSL, and the like, and may be connected to the read/write circuit 40 via a bit line BL. In some implementations, the plurality of memory cells arranged in the same row may be connected to the same word line WL, and the plurality of memory cells arranged in the same column may be connected to the same bit line BL.

The plurality of memory cells included in the memory cell array 20 may be divided into a plurality of memory blocks. Each memory block may include a plurality of word lines WL, a plurality of string select lines SSL, a plurality of ground select lines GSL, a plurality of bit lines BL, and one or more common source lines CSL.

The driving circuit 30 and the read/write circuit 40 may be operated by the control circuit 50. In some implementations, the driving circuit 30 may receive address information ADDR from an external source and decode the received address information ADDR to select at least a portion of the word lines WL, the common source line CSL, the string select lines SSL, and the ground select lines GSL connected to the memory cell array. The driving circuit 30 may include a circuit for driving each of the word lines WL, the string select lines SSL, and the common source line CSL.

The read/write circuit 40 may select at least a portion of the bit lines BL connected to the memory cell array 20 according to a command received from the control circuit 50. The read/write circuit 40 may read data stored in a memory cell connected to the selected portion of the bit lines BL, or may write data to the memory cell connected to the selected portion of the bit lines BL. The read/write circuit 40 may include circuits, such as a page buffer circuit, an input/output buffer circuit, a data latch circuit, and the like, in order to perform the above-described operations.

The control circuit 50 may control operations of the driving circuit 30 and the read/write circuit 40 in response to a control signal CTRL transmitted from an external source. When data stored in the memory cell array 20 is read, the control circuit 50 may control an operation of the driving circuit 30 so as to supply a voltage to the word line WL in which data to be read is stored for a reading operation. When the voltage for a reading operation is supplied to a specific word line WL, the control circuit 50 may control the read/write circuit 40 to read data stored in a memory cell connected to the word line WL to which the voltage for a reading operation is supplied.

When data is to be written in the memory cell array 20, the control circuit 50 may control an operation of the driving circuit 30 so as to supply a voltage to a word line WL to which data is to be written in the writing operation. When the voltage for the writing operation is supplied to a specific word line WL, the control circuit 50 may control the read/write circuit 40 to write data to a memory cell connected to the word line WL to which the voltage for the writing operation is supplied.

Figure 2:
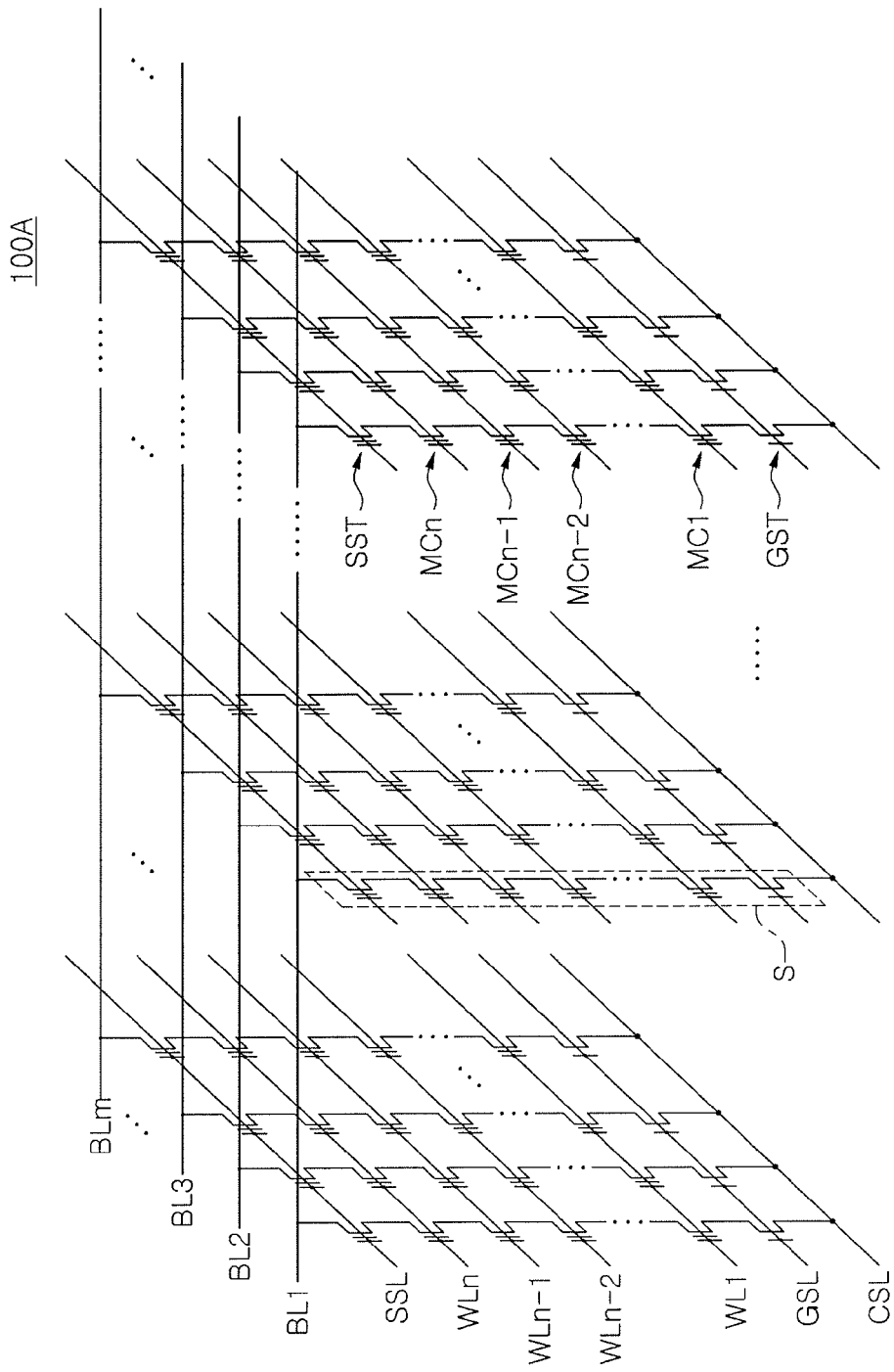
FIG. 2 illustrates an equivalent circuit diagram of a memory cell array of a semiconductor device according to an example embodiment.

FIG. 2 is an equivalent circuit diagram illustrating a memory cell array of a semiconductor device according to an example embodiment. In particular, FIG. 2 is an equivalent circuit diagram illustrating a three-dimensional structure of a memory cell array included in a vertical semiconductor device 100A.

Referring to FIG. 2, the memory cell array according to the present example embodiment may include a plurality of memory cell strings S. Each of the memory cell strings S includes n memory cell devices MC1 to MCn connected to each other in series, and a ground select transistor GST and a string select transistor SST respectively connected to both ends of the memory cell devices MC1 to MCn in series.

The n memory cell devices MC1 to MCn connected to each other in series may be respectively connected to word lines WL1 to WLn for the selection of at least a portion of the memory cell devices MC1 to MCn.

A gate terminal of the ground select transistor GST may be connected to a ground select line GSL, and a source terminal of the ground select transistor GST may be connected to a common source line CSL. A gate terminal of the string select transistor SST may be connected to a string select line SSL, and a source terminal of the string select transistor SST may be connected to a drain terminal of a memory cell device MCn. In FIG. 2, one ground select transistor GST and one string select transistor SST are connected to the n memory cell devices MC1 to MCn connected to each other in series. In another implementation, a plurality of ground select transistors GST or a plurality of string select transistors SST may be connected to the n memory cell devices MC1 to MCn.

A drain terminal of the string select transistor SST may be connected to a plurality of bit lines BL1 to BLm. When a signal is applied to the gate terminal of the string select transistor SST via the string select line SSL, the signal applied via the bit lines BL1 to BLm is transmitted to the n memory cell devices MC1 to MCn connected to each other in series, and a data reading or data writing operation may be performed.

Figure 3:
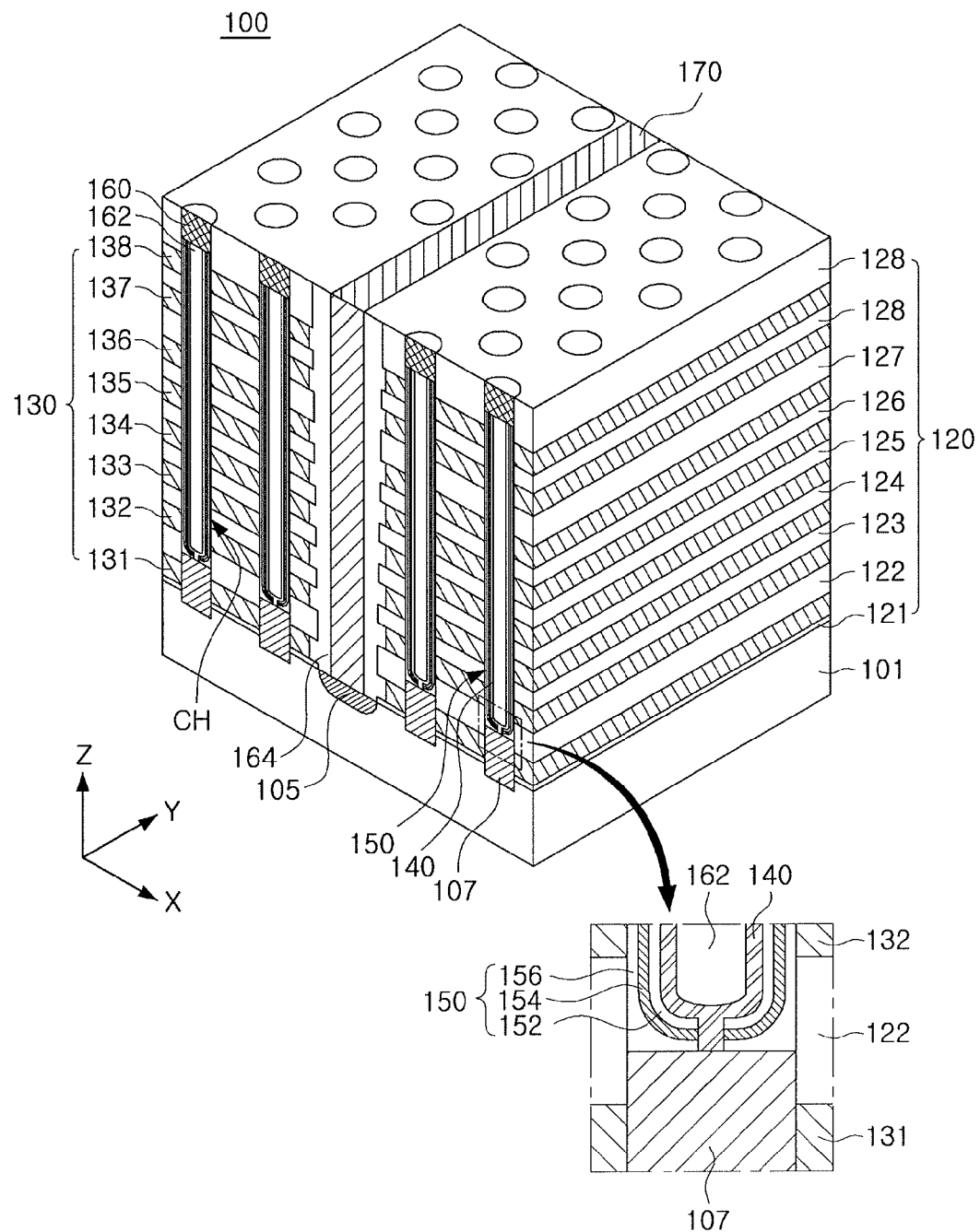
FIG. 3 illustrates a schematic perspective view of a structure of memory cell strings of a semiconductor device according to an example embodiment.

FIG. 3 is a schematic perspective view illustrating a structure of memory cell strings of a semiconductor device according to an example embodiment.

Referring to FIG. 3, a semiconductor device 100 may include a substrate 101, channel holes CH extending perpendicularly to an upper surface of the substrate 101 and including channel areas 140 disposed thereinside, and a plurality of interlayer insulating layers 120 and gate electrodes 130 stacked on outer sidewalls of the channel holes CH. In addition, the semiconductor device 100 may further include gate dielectric layer 150 disposed between the channel areas 140 and the gate electrodes 130, epitaxial layers 107 disposed below the channel areas 140, channel pads 160 disposed on the channel holes CH, an impurity area 105 disposed in the substrate 101 between the gate electrodes 130, and a conductive layer 170 disposed on the impurity area 105. In FIG. 3, some components, such as upper interconnection structures such as bit lines BL1 to BLm (refer to FIG. 2) are omitted for clarity.

In the semiconductor device 100, one memory cell string may be configured around each channel area 140, and a plurality of memory cell strings may be arranged to form rows and columns in an x-axis direction and a y-axis direction.

The substrate 101 may include the upper surface extending in the x-axis direction and the y-axis direction. The substrate 101 may include a semiconductor material. For example, the substrate 101 may be a Group IV semiconductor, a Group III-V compound semiconductor, or a Group II-VI oxide semiconductor. For example, the Group IV semiconductor may include silicon, germanium, or silicon-germanium. The substrate 101 may be provided in the form of, for example, a bulk wafer or an epitaxial layer.

The channel holes CH may be spaced apart from each other in rows and columns on the substrate 101, and may be arranged to be shifted from each other in the y-axis direction. Thus, the channel holes CH may be arranged to form a lattice pattern or a zigzag pattern in one direction. In an embodiment, the channel holes CH may have a cross-section which is not an exact circle shape but a distorted circle shape on an x-y plane. This will be described in detail with reference to FIG. 4. The channel holes CH may have an inclined side surface such that a width thereof is narrowed toward the substrate 101 according to an aspect ratio thereof.

The channel areas 140 having a columnar shape may be in each channel hole CH extending perpendicularly to the upper surface of substrate 101. In the channel holes CH, the channel areas 140 may have an annular shape surrounding a first insulating layer 162 disposed thereinside. In another implementation, the channel areas 140 may have a columnar shape, such as a cylindrical or prismatic shape, with no first insulating layer 162. Portions of the channel areas 140 may be dummy channel areas. Herein, the term "dummy" refers to a configuration that exists only as a pattern substantially with no electrical functionality in the semiconductor device 100, while having the same structure and shape as or a similar structure and shape to a component of the semiconductor device 100. Accordingly, electrical signals may not be applied to the "dummy" component, or the "dummy" component may not perform electrically the same function as the component of the semiconductor device 100 even when the electrical signals are applied.

A lower end of the channel area 140 may be connected to the substrate 101. The channel area 140 may include a semiconductor material, such as polycrystalline silicon or single crystalline silicon, and the semiconductor material may be undoped material, or a material containing n-type or p-type impurities.

The gate electrodes 130 (for example, gate electrodes 131 to 138) may be arranged on respective side surfaces of the gate dielectric areas 150 and spaced apart in a direction perpendicular to the substrate 101. Referring also to FIG. 2, each of the gate electrodes 130 may form gate terminals of the ground select transistor GST, the plurality of memory cells MC1 to MCn, or the string select transistor SST. The gate electrodes 130 may extend to form the word lines WL1 to WLn, and may be commonly connected by a predetermined unit of adjacent memory cell strings S arranged in the x-axis direction and the y-axis direction. In the present example embodiment, five gate electrodes 132 to 136 of the memory cells MC1 to MCn are arranged, but, depending, for example, on the capacity of the semiconductor device 100, the number of the gate electrodes 130 of the memory cells MC1 to MCn may be varied. For example, the number of gate electrodes 130 forming the memory cells MC1 to MCn may be $2^n$ (in which n is a natural number).

A gate electrode 131 of the ground select transistors GST may extend in the y-axis direction to form the ground select lines GSL. In order to implement functions of the ground select transistors GST, a predetermined amount of impurities may be doped in the substrate 101 below the gate electrode 131.

Gate electrodes 137 and 138 of the string select transistors SST may extend in the y-axis direction to form the string select lines SSL. The gate electrodes 137 and 138 of the string select transistors SST arranged in a line in the x-axis direction may serve adjacent memory cell strings S to be respectively connected to different bit lines BL1 to BLm (please refer to FIG. 2) by an additional interconnection structure. In some example embodiments, the gate electrodes 137 and 138 of the string select transistors SST may be separated from each other between the memory cell strings S adjacent to each other in the x-axis direction to form different string select lines SSL. In some example embodiments, one or more gate electrodes 137 and 138 of the string select transistors SST, and one or more gate electrodes 131 of the ground select transistors GST may be disposed, and may have structures the same as or different from those of the gate electrodes 132 to 136 of the memory cells MC1 to MCn.

In addition, some of the gate electrodes 130, such as the gate electrodes disposed adjacent to the gate electrode 131 of the ground select transistors GST or the gate electrodes 137 and 138 of the string select transistors SST, may be dummy gate electrodes. For example, the gate electrode 132 disposed adjacently to the gate electrode 131 of the ground select transistors GST may be a dummy gate electrode.

The gate electrodes 130 may include, for example, polycrystalline silicon or a metal silicide material. The metal silicide material may be, for example, a silicide material of cobalt (Co), nickel (Ni), hafnium (Hf), platinum (Pt), tungsten (W), titanium (Ti), or a combination thereof. In some example embodiments, the gate electrodes 130 may include a metal such as W. In addition, the gate electrodes 130 may further include a diffusion barrier layer. For example, the diffusion barrier layer may include WN, TaN, TiN, or a combination thereof.

The plurality of interlayer insulating layers 120 (for example, interlayer insulating layers 121 to 129) may be arranged between the gate electrodes 130. The interlayer insulating layers 120, like the gate electrodes 130, may be arranged to be spaced apart from each other in the z-axis direction and to extend in the y-axis direction. The interlayer insulating layers 120 may include an insulating material such as silicon oxide or silicon oxide.

The gate dielectric layer 150 may be disposed between the gate electrodes 130 and the channel areas 140 in the channel holes CH. The gate dielectric layer 150 may vertically extend from the substrate 101 along the channel areas 140. The gate dielectric layer 150 may be partially removed on the epitaxial layers 107 so that the channel areas 140 are connected to the epitaxial layers 107.

The gate dielectric layer 150 may include a tunneling layer 152, a charge storage layer 154, and a blocking layer 156, sequentially stacked on the channel areas 140. As described in detail below, an inner circumference and an outer circumference of one or more layers configuring the gate dielectric layer 150 may have different shapes.

The tunneling layer 152 may allow charges to be tunneled into the charge storage layer 154 by an F-N tunneling mechanism. The tunneling layer may include, for example, silicon oxide ($SiO_2$), silicon nitride ($Si_3N_4$), silicon oxynitride (SiON), or a combination thereof.

The charge storage layer 154 may be a charge trapping layer or a floating gate conductive layer. For example, the charge storage layer 154 may include a dielectric material, quantum dots, or nanocrystals. The quantum dots or nanocrystals may be formed of microparticles of a conductive material, such as a metal or a semiconductor material. In some example embodiments, when the charge storage layer 154 is the charge trapping layer, the charge storage layer 154 may be formed of silicon nitride.

The blocking layer 156 may include, for example, silicon oxide ($SiO_2$), silicon nitride ($Si_3N_4$), silicon oxynitride (SiON), a high-k dielectric material, or a combination thereof. The high-k dielectric material may be, for example, aluminum oxide ($Al_2O_3$), tantalum oxide ($Ta_2O_5$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), or praseodymium oxide ($Pr_2O_3$).

At least one of the layers configuring the gate dielectric layer 150 may include a rounded corner connecting a side surface on the sidewall of the channel hole CH to a lower surface on the epitaxial layers 107. In the case of the blocking layer 156, which is the outermost layer of the gate dielectric layer 150, while an outer surface of the blocking layer 156 in contact with the interlayer insulating layers 120 and gate electrodes 130 has a square corner connecting a side surface to a lower surface thereof, an inner surface of the blocking layer 156 in contact with the charge storage layer 154 may have a rounded corner connecting a side surface to a lower surface thereof. Accordingly, a thickness of the blocking layer 156 in the corner may be greater than a thickness of the blocking layer 156 on the sidewall of the channel hole CH and a thickness of the blocking layer 156 on the epitaxial layers 107.

The epitaxial layers 107 may be disposed at lower ends of the channel holes CH on the substrate 101, and on a side surface of at least one of the gate electrodes 130. The epitaxial layers 107 may be disposed in a recessed portion of the substrate 101. Upper surfaces of the epitaxial layers 107 may be disposed at a higher level than an upper surface of the lowermost gate electrode 131, and at a lower level than a lower surface of the next lowermost gate electrode 132. With the epitaxial layers 107, the channel areas 140 may be stably electrically connected to the substrate 101 even when an aspect ratio of the channel areas 140 is high and characteristics of the ground select transistors GST of the memory cell strings may be made uniform. In another implementation, the epitaxial layers 107 may be omitted, and the channel areas 140 may be in direct contact with the substrate 101.

The epitaxial layers 107 may be formed, for example, in a selective epitaxial growth (SEG) process. The epitaxial layers 107 may be formed as a single layer or a plurality of layers. The epitaxial layers 107 may include, for example, doped or undoped polycrystalline silicon, single crystalline silicon, polycrystalline germanium, or single crystalline germanium. For example, when the substrate 101 is single crystalline silicon, the epitaxial layers 107 may also be single crystalline silicon. In some example embodiments, even when the substrate 101 is single crystalline silicon, at least a portion of the epitaxial layers 107 may have a polycrystalline silicon structure including a plurality of grains.

The channel pads 160 may be disposed on the memory cell strings to cover upper surfaces of first insulating layers 162 and may be electrically connected to the channel areas 140. The channel pads 160 may include, for example, doped polycrystalline silicon. The channel pads 160 may function as drain areas of the string select transistors SST (please refer to FIG. 2). The channel pads 160 may be electrically connected to the bit lines BL1 to BLm (please refer to FIG. 2) via connecting structures, such as contact plugs.

The conductive layer 170 may be disposed between the channel areas 140 and may pass through the gate electrodes 130 and the interlayer insulating layers 120 to be connected to the substrate 101. In addition, the conductive layer 170 may be electrically isolated from the gate electrodes 130 by a second insulating layer 164. The gate electrodes 130 may be separated from each other in the x-axis direction, with the conductive layer 170 therebetween. The conductive layer 170 may have a line shape extending in the y-axis direction. The conductive layer 170 may be disposed, for example, for every two or four columns of the channel areas 140 in the x-axis direction. The conductive layer 170 may have a width decreasing toward the substrate 101 due to a high aspect ratio thereof.

The impurity area 105 may be disposed in the substrate 101 below the conductive layer 170. The impurity area 105 may be adjacent to the upper surface of the substrate 101 and may extend in the y-axis direction. The impurity area 105 may include the same conductivity-type impurities as the substrate 101 or the opposite conductivity-type impurities to the substrate 101. When the impurity area 105 includes the same conductivity-type impurities as the substrate 101, the impurity area 105 may include a higher concentration of impurities than the substrate 101. The conductive layer 170 may transmit a voltage to the substrate 101 via the impurity area 105.

Figure 4:
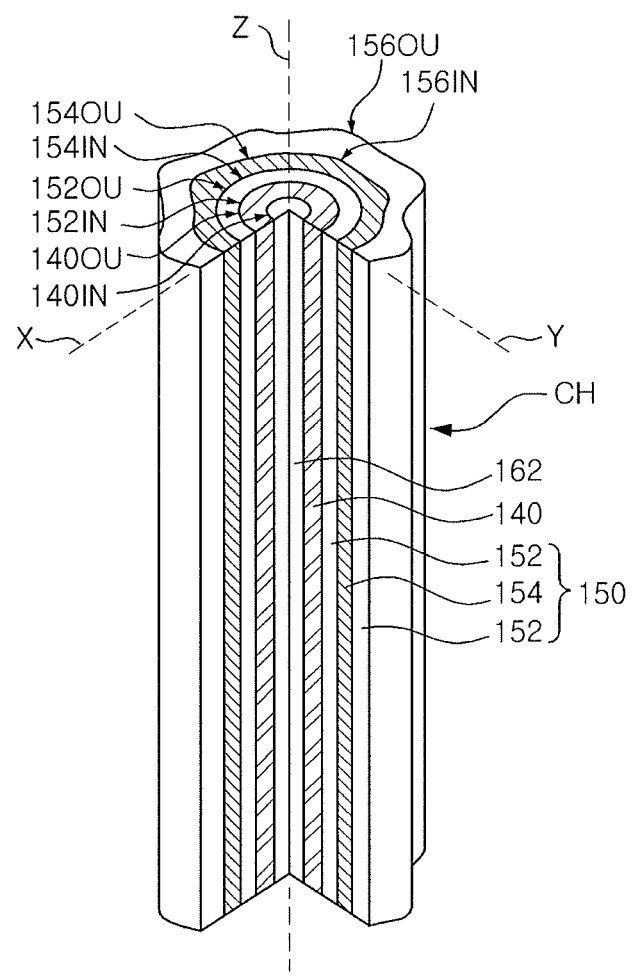
FIG. 4 illustrates an enlarged, partially cutaway perspective view of a channel hole CH in FIG. 3.

FIG. 4 is an enlarged, partial cutaway perspective view of one of the channel holes CH in FIG. 3.

Referring to FIG. 4, the channel hole CH may have a wavy circular (or oval—see FIG. 5C) cross-section in a plan view. Thus, the channel hole CH may have a partially modified circular shape rather than a perfectly circular shape. Such a shape may be present as the aspect ratio of the channel hole CH increases, for example, if an etchant is not uniformly delivered during an etching process for forming the channel hole CH. The shape of the channel hole CH illustrated in FIG. 4 is merely an example of the modified circular shape.

In the present example embodiment, the blocking layer 156 is formed in the outermost portion of the channel hole CH having such an irregular shape. Thus, an outer circumference 156OU of the blocking layer 156 may have a profile according to the shape of the channel hole CH. An inner circumference 156IN of the blocking layer 156 may have greater circularity than the outer circumference 156OU of the blocking layer 156. The inner circumference and the outer circumference respectively refer to an outer contour and an inner contour in the cross-section in the x-y plane of FIG. 3. Whether a shape is more circular or not may be determined in consideration of the number of inflection points, variations in the radius of curvature, and the like. For example, when the number of inflection points is relatively small, the shape may be determined to be relatively circular. As another example, whether a shape is more circular or not may be determined by measuring radii of curvatures in a plurality of locations along the inner circumference 156IN and the outer circumference 156OU and analyzing variations therein, as described below. Variations in the radius of curvature of the inner circumference 156IN may be smaller (and the circularity may be greater) than variations in the radius of curvature of the outer circumference 156OU. Such a shape may be formed by a manufacturing method described below with reference to FIG. 8E.

The charge storage layer 154 disposed on an inner side of the blocking layer 156 is in contact with the inner circumference 156IN of the blocking layer 156. Thus, an outer circumference 154OU of the charge storage layer 154 may have the same shape as the inner circumference 156IN of the blocking layer 156. In an implementation, an inner circumference 154IN of the charge storage layer 154 may have greater circularity than the outer circumference 154OU of the charge storage layer 154.

The tunneling layer 152 disposed on an inner side of the charge storage layer 154 is in contact with the inner circumference 154IN of the charge storage layer 154. Thus, an outer circumference 152OU of the tunneling layer 152 may have the same shape as the inner circumference 154IN of the charge storage layer 154. An inner circumference 152IN of the tunneling layer 152 may have greater circularity than the outer circumference 152OU of the tunneling layer 152, or may have a shape corresponding to the outer circumference 152OU of the tunneling layer 152. The term "a shape corresponding to" refers to a state in which a profile including waves or embossings is the same as or similar to another profile as a whole even when a degree of sharpness of the waves or embossings is somewhat different thereto, and includes a state in which such a shape is shrunk or expanded.

The channel area 140 disposed on an inner side of the tunneling layer 152 is in contact with the inner circumference 152IN of the tunneling layer 152. Thus, an outer circumference 140OU of the channel area 140 may have the same shape as the inner circumference 152IN of the tunneling layer 152. An inner circumference 140IN of the channel area 140 may have greater circularity than the outer circumference 140OU of the channel area 140, or may have a shape corresponding to the outer circumference 140OU of the channel area 140.

In this manner, outer circumferences and/or inner circumferences of the gate dielectric layer 150 and channel area 140 disposed in the channel hole CH may have more gentle embossings or waves and become more circular toward a center of the channel hole CH from an edge of the channel hole CH.

Figure 5A:
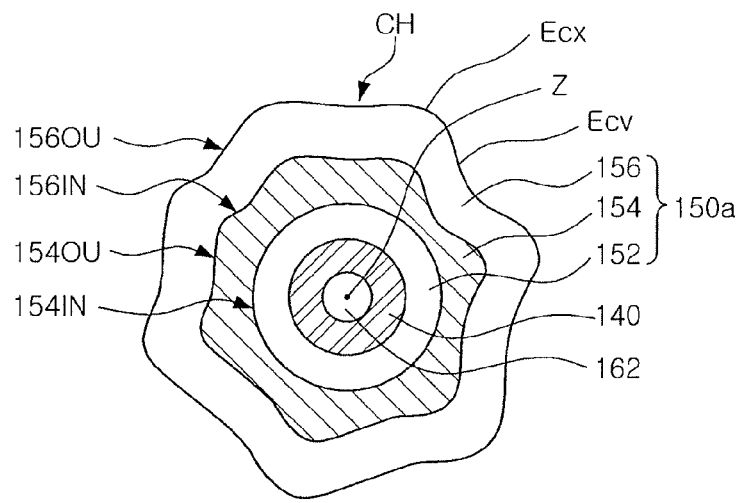
FIGS. 5A to 5C illustrate schematic plan views of semiconductor devices according to example embodiments.
Figure 5B:
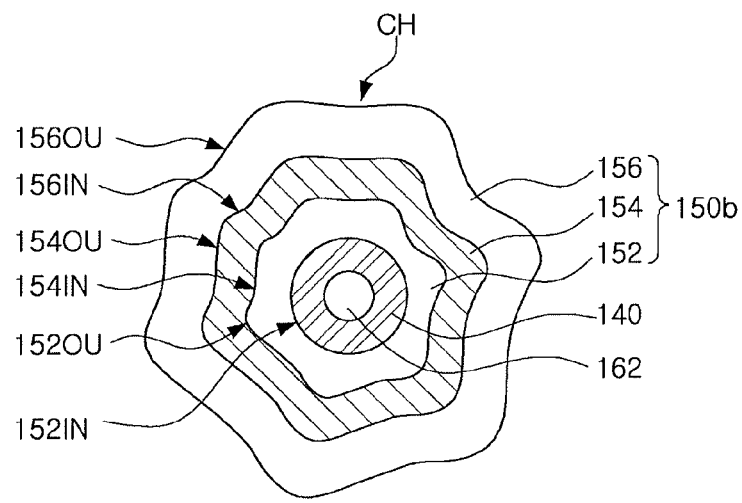
Figure 5C:
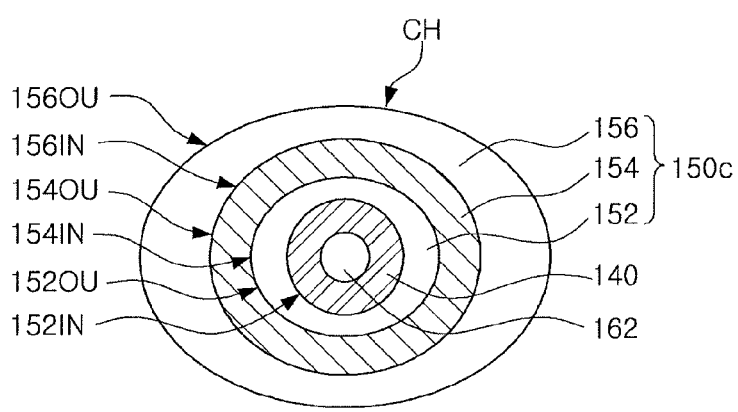

FIGS. 5A to 5C are schematic plan views illustrating semiconductor devices according to example embodiments.

FIG. 5A illustrates a channel area 140, a gate dielectric layer 150a, and a first insulating layer 162, disposed in a channel hole CH.

In the gate dielectric layer 150a according to the present example embodiment, a shape of an inner circumference 156IN of a blocking layer 156 may have a shape corresponding to an outer circumference 156OU of the blocking layer 156. Thus, the blocking layer 156 may be uniformly deposited on an inner sidewall of the channel hole CH, and the outer circumference 156OU and the inner circumference 156IN of the blocking layer 156 may have the shape in accordance with a shape of the channel hole CH. An inner circumference 154IN of the charge storage layer 154 may have greater circularity than an outer circumference 154OU of the charge storage layer 154.

The tunneling layer 152 and the channel area 140 may have greater circularity than the inner circumference 154IN of the charge storage layer 154, or a shape corresponding to the shape of the inner circumference 154IN of the charge storage layer 154.

In an implementation, the channel area 140 may be surrounded by the dielectric area 150, and an outermost edge of the channel area 140 may be only convex relative to the vertical axis. An outermost edge of the dielectric area 150 (next to a gate electrodes) may have at least one concave portion Ecv and at least one convex portion Ecx relative to a vertical axis (for example, in the x-y plane and relative to the z-axis) of the channel structure.

FIG. 5B illustrates a channel area 140, a gate dielectric layer 150b, and a first insulating layer 162, disposed in a channel hole CH.

In the gate dielectric layer 150b according to the present example embodiment, a shape of an inner circumference 156IN of a blocking layer 156 may have a shape corresponding to an outer circumference 156OU of the blocking layer 156. Thus, the blocking layer 156 is uniformly deposited on an inner sidewall of the channel hole CH, and the outer circumference 156OU and the inner circumference 156IN of the blocking layer 156 may have the shape in accordance with the shape of the channel hole CH. In addition, a shape of an inner circumference 154IN of a charge storage layer 154 may also have a shape corresponding to an outer circumference 154OU of the charge storage layer 154. An inner circumference 152IN of a tunneling layer 152 may have greater circularity than an outer circumference 152OU of the tunneling layer 152.

The channel area 140 may have greater circularity than the inner circumference 152IN of the tunneling layer 152, or a shape corresponding to the shape of the inner circumference 152IN of the tunneling layer 152.

FIG. 5C illustrates a channel area 140, a gate dielectric layer 150c, and a first insulating layer 162, disposed in a channel hole CH.

The channel hole CH according to the present example embodiment may have an oval shape or a shape similar thereto in a plan view. In the gate dielectric layer 150c, an outer circumference and an inner circumference of each of a tunneling layer 152, a charge storage layer 154, and a blocking layer 156 may have different shapes. In other example embodiments, the outer circumference and the inner circumference of only a portion of the tunneling layer 152, the charge storage layer 154, and the blocking layer 156 may have different shapes from each other.

The blocking layer 156 disposed in the outermost portion of the channel hole CH is formed in such an oval-shaped channel hole CH. Thus, an outer circumference 156OU of the blocking layer 156 may have a profile in accordance with the shape of the channel hole CH. In an implementation, an inner circumference 156IN of the blocking layer 156 may have greater circularity than the outer circumference 156OU of the blocking layer 156. Inner circumferences 154IN and 152IN of the charge storage layer 154 and the tunneling layer 152 may also have greater circularity than outer circumferences 154OU and 152IN of the charge storage layer 154 and the tunneling layer 152, respectively.

The channel area 140 may have greater circularity than the inner circumference 152IN of the tunneling layer 152, or may have a shape corresponding to the shape of the inner circumference 152IN of the tunneling layer 152.

As illustrated in FIGS. 5A to 5C, one or more of the layers configuring the gate dielectric layers 150a, 150b, and 150c inner circumference may have greater circularity than the outer circumference. In addition, the outer circumference and/or the inner circumference of one or more of the layers configuring the gate dielectric layers 150a, 150b, and 150c may have more gentle embossings or waves and have greater circularity toward a center from an edge of the channel hole CH.

Figure 6:
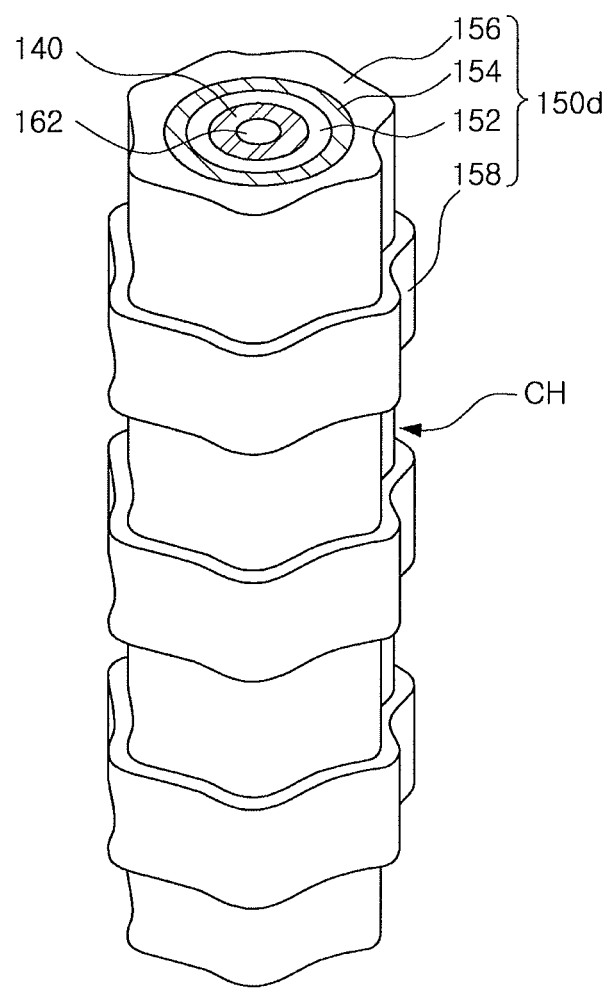
FIG. 6 illustrates a partially cutaway perspective view of a semiconductor device according to the example embodiment illustrated in FIG. 3.

FIG. 6 is a partially cutaway perspective view illustrating a semiconductor device according to the example embodiment illustrated in FIG. 3. FIG. 6 illustrates a portion corresponding to the channel hole CH in FIG. 4.

FIG. 6 illustrates a channel area 140, a gate dielectric layer 150d, and a first insulating layer 162, disposed in a channel hole CH.

The gate dielectric layer 150d according to the present example embodiment may further include a second blocking layer 158 in addition to a tunneling layer 152, a charge storage layer 154, and a first blocking layer 156. The second blocking layer 158 may be disposed between the channel hole CH and the gate electrodes 130 (please refer to FIG. 3) in an outer side of the channel hole CH. The second blocking layer 158 may have an outer circumference corresponding to a shape of the channel hole CH. In another implementation, portions of upper and lower ends of the second blocking layer 158 may extend to the x-y plane of FIG. 3 along the gate electrodes 130.

The first and second blocking layers 156 and 158 may be formed of the same material or different materials. For example, the first blocking layer 156 may include a high-k dielectric material, and the second blocking layer 158 may include silicon oxide. In another implementation, for example, the first blocking layer 156 may include silicon oxide, and the second blocking layer 158 may include a high-k dielectric material.

Figure 7A:
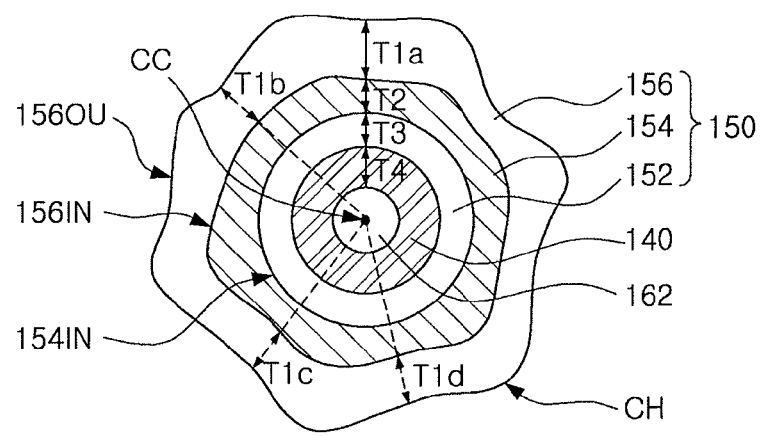
FIGS. 7A and 7B illustrate diagrams of characteristics of a semiconductor device according to an example embodiment.
Figure 7B:
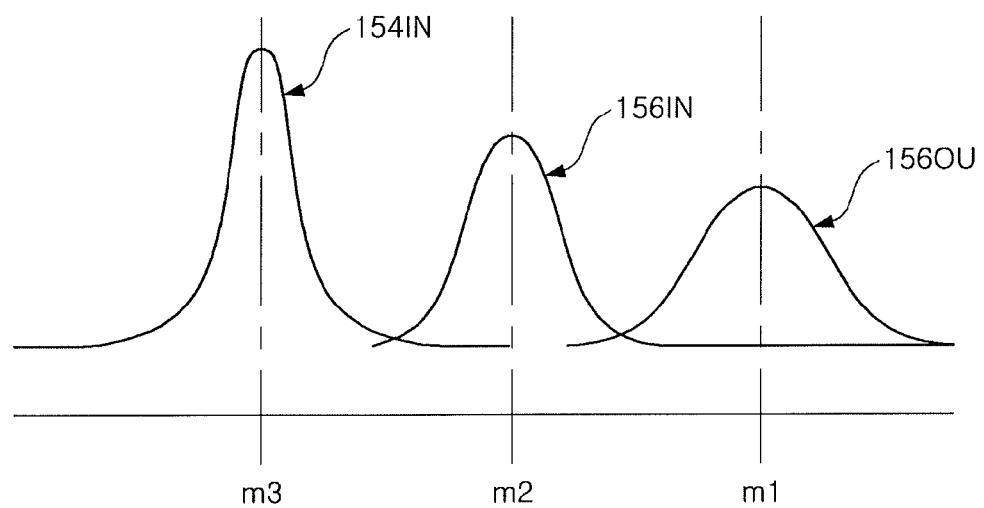

FIGS. 7A and 7B are diagrams illustrating characteristics of a semiconductor device according to an example embodiment.

Referring to FIG. 7A, in a structure of the gate dielectric layer 150 corresponding to the example embodiment of FIG. 4, the blocking layer 156 has first thicknesses T1a to T1d, the charge storage layer 154 has a second thickness T2, the tunneling layer 152 has a third thickness T3, and the channel area 140 has a fourth thickness T4. Relative values of the first to fourth thicknesses T1a to T4 may be variously changed according to example embodiments.

In the example embodiment illustrated in FIG. 7A, the outer circumference 156OU of the blocking layer 156 has a different shape from the inner circumference 156IN of the blocking layer 156, and the blocking layer 156 has various thicknesses T1a to T1d at respective locations (in FIG. 7A, the thicknesses T1a to T1d at the respective locations are measured in directions extending from a center point CC of the channel hole CH). As illustrated in FIG. 7A, the thicknesses T1a to T1d of the blocking layer 156 may not be constant but may vary along the inner circumference 156IN of the blocking layer 156, and may increase and decrease around the center point CC. Similarly, the charge storage layer 154 and the tunneling layer 152 may also have a plurality of thicknesses in a plurality of locations.

FIG. 7A illustrates variations in circularity. As illustrated in the example embodiment in FIG. 7A, variations in the first thicknesses T1a to T1d of the blocking layer 156 may be greater than variations in thicknesses of the inner layers. The variation refers to a degree of distribution from an average value, and a variance, a standard deviation, or the like may be a measure thereof. In the example embodiment illustrated in FIG. 7A, the outer circumferences and inner circumferences have greater circularity toward the tunneling layer 152 from the blocking layer 156. Thus, the variations in thickness of the respective layers may be gradually decreased when progressing towards the center of the channel hole CH. Thus, influence of the shape of the channel hole CH may be gradually decreased. Accordingly, the gate dielectric layer 150 may be prevented from locally having different thicknesses due to severe distortion in shape, and occurrence of failure caused thereby may be reduced or prevented.

Variations in the fourth thickness T4 of the channel area 140 may be the smallest. Thus, the channel area 140 may have a substantially uniform thickness around the center point CC. For example, when an average value of the fourth thickness T4 of the channel area 140 is in the range of 5 nm to 10 nm, a standard deviation thereof may be 3% of the average value or less.

Referring to FIG. 7B, variations in radius of curvature of the outer circumference 156OU of the blocking layer 156, the inner circumference 156IN of the blocking layer 156, and the inner circumference 154IN of the charge storage layer 154 in the structure illustrated in FIG. 7A are illustrated by way of example. The inner circumference 156IN of the blocking layer 156 may correspond to the outer circumference 154OU of the charge storage layer 154.

The variations in radius of curvature may refer to variations in radius of curvature at respective locations along the circumference of the channel hole CH.

When the radii of curvatures are assumed to have a normal distribution, the average values m1, m2, and m3 of the radii of curvatures may be decreased when progressing inwardly from the outer circumference 156OU of the blocking layer 156 in the channel hole CH, as illustrated in FIG. 7B. Thus, the average values of the radii of curvatures may be m1>m2>m3.

Referring to FIG. 7B, the layers configuring the gate dielectric layer 150 have greater circularity in outer circumferences when progressing toward the center from the edge of the channel hole CH; for the respective layers, standard deviations in radii of curvatures of the respective outer circumferences decrease when progressing inwardly toward the center of the channel hole CH. Accordingly, sharpness of peaks around the average values m1, m2, and m3 in distribution of the radii of curvatures may increase toward the center of the channel hole CH, as illustrated in FIG. 7B. For example, the variations in radius of curvature of the outer circumference 156OU of the blocking layer 156 may be greater than that of the inner circumference 156IN of the blocking layer 156. Such a variation in the radius of curvature may be gradually decreased in order of layers disposed inside the channel hole CH, that is, the charge storage layer 154, the tunneling layer 152, and the channel area 140.

FIGS. 8A to 8M illustrate cross-sectional views of stages in a method of fabricating a semiconductor device according to an example embodiment. FIGS. 8A to 8M illustrate a region corresponding to the x-z cross-sectional area in the perspective view of FIG. 3.

Figure 8A:
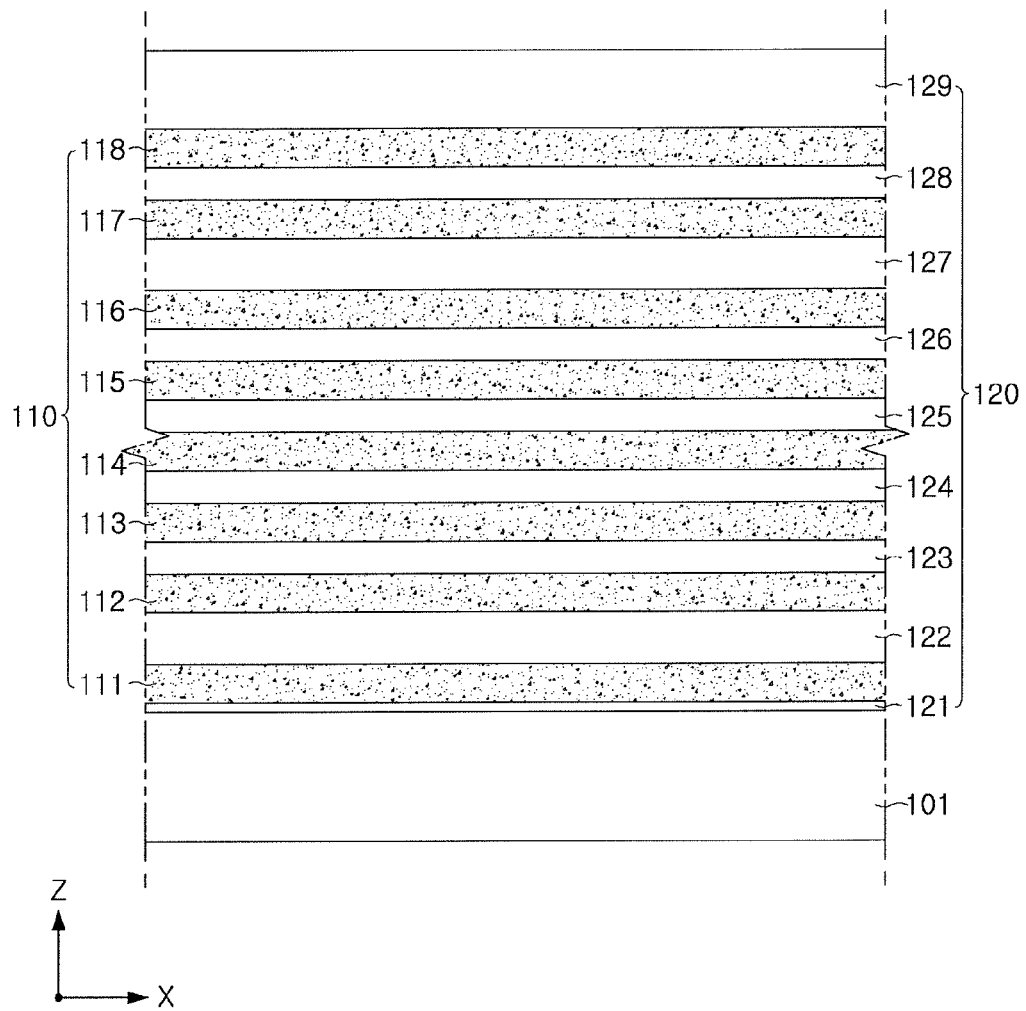
FIGS. 8A to 8M illustrate cross-sectional views of stages in a method of fabricating a semiconductor device according to an example embodiment.

Referring to FIG. 8A, sacrificial layers 111 to 118: 110 and interlayer insulating layers 120 may be alternately stacked on a substrate 101.

First, starting with a first interlayer insulating layer 121, the interlayer insulating layers 120 and the sacrificial layers 110 may be alternately stacked on the substrate 101, as illustrated in FIG. 8A. The sacrificial layers 110 may be formed of a material having an etch selectivity with respect to the interlayer insulating layers 120. Thus, the sacrificial layers 110 may be formed of materials capable of being etched while minimizing etching of the interlayer insulating layers 120, during a process of etching the sacrificial layers 110. Such etch selectivity may be quantitatively expressed as a ratio of an etching rate of the sacrificial layers 110 to an etching rate of the interlayer insulating layers 120. For example, the interlayer insulating layers 120 may be formed of at least one of silicon oxide and silicon nitride, and the sacrificial layers 110 may be formed of a different material from the interlayer insulating layers 120, among the materials selected from silicon, silicon oxide, silicon carbide, and silicon nitride.

As illustrated in FIG. 8A, in some example embodiments, thicknesses of the interlayer insulating layers 120 may not be the same. The lowermost interlayer insulating layer 121 of the interlayer insulating layers 120 may be relatively thin, and the uppermost interlayer insulating layer 129 of the interlayer insulating layers 120 may be relatively thick. In some example embodiments, interlayer insulating layers 122 and 127 disposed between the ground select transistor GST and the memory cells MC1 to MCn and between the string select transistor SST and the memory cells MC1 to MCn illustrated in FIG. 2 may be thicker than interlayer insulating layers 123 to 126 disposed between the memory cells MC1 to MCn. The thicknesses of the interlayer insulating layers 120 and the sacrificial layers 110 may be variously modified from those illustrated in FIG. 8A. The numbers of layers configuring the interlayer insulating layers 120 and the sacrificial layers 110 may be variously changed, too.

In some example embodiments, a predetermined amount of impurities may be doped in the substrate 101 corresponding to a portion on which a gate electrode 131 (refer to FIG. 3) is to be formed, in order to allow an electrical action between the impurity area 105 and the ground select transistor GST.

Figure 8B:
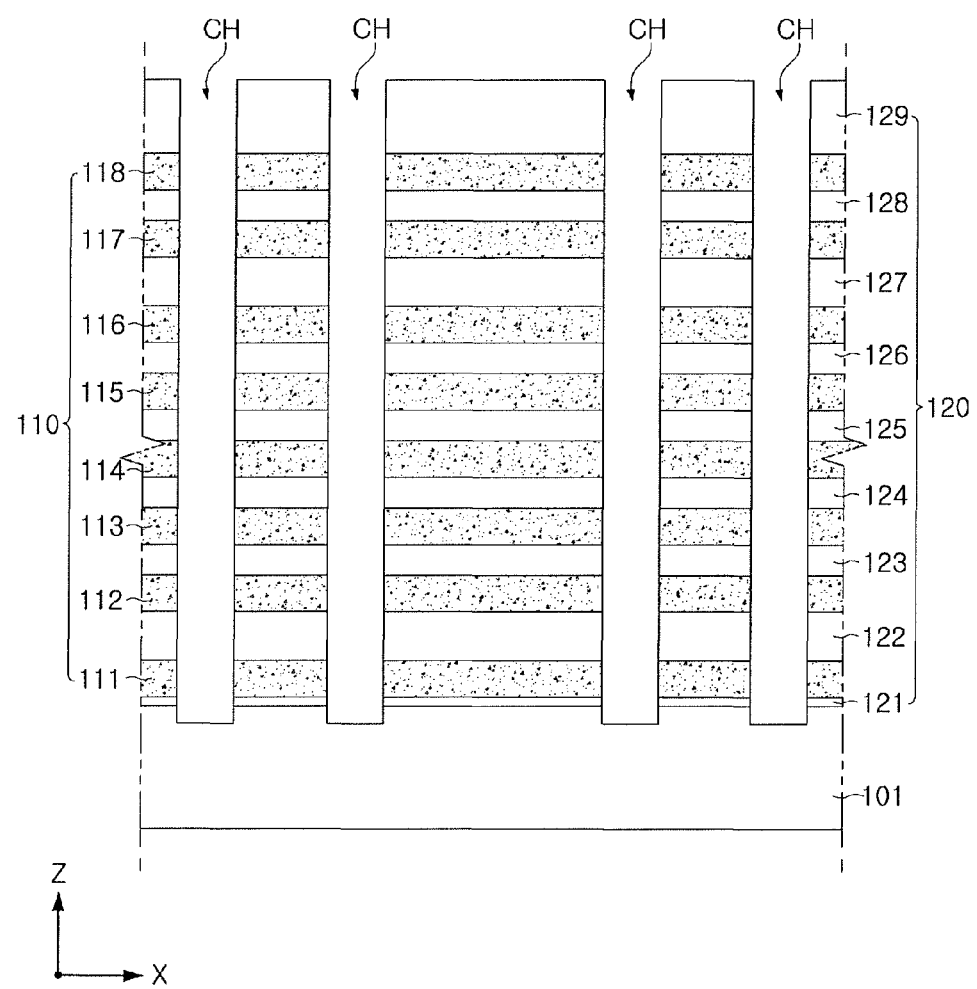

Referring to FIG. 8B, channel holes CH perpendicularly extending to the substrate 101 may be formed.

The channel holes CH may be formed by anisotropically etching the sacrificial layers 110 and the interlayer insulating layers 120. In the present example embodiment, a stacked structure including two different types of layers is etched. Thus, sidewalls of the channel holes CH may not be perpendicular to an upper surface of the substrate 101. For example, widths of the channel holes CH may be decreased toward the upper surface of the substrate 101. The substrate 101 may be partially recessed by the channel holes CH.

Due to a high aspect ratio of the channel holes CH, cross-sectional areas of the channel holes CH may not form a perfect circle on an x-y plane, which is not illustrated in FIG. 8B. As illustrated in FIG. 4, the channel holes CH may have distorted circular cross-sections including embossings and waves.

Figure 8C:
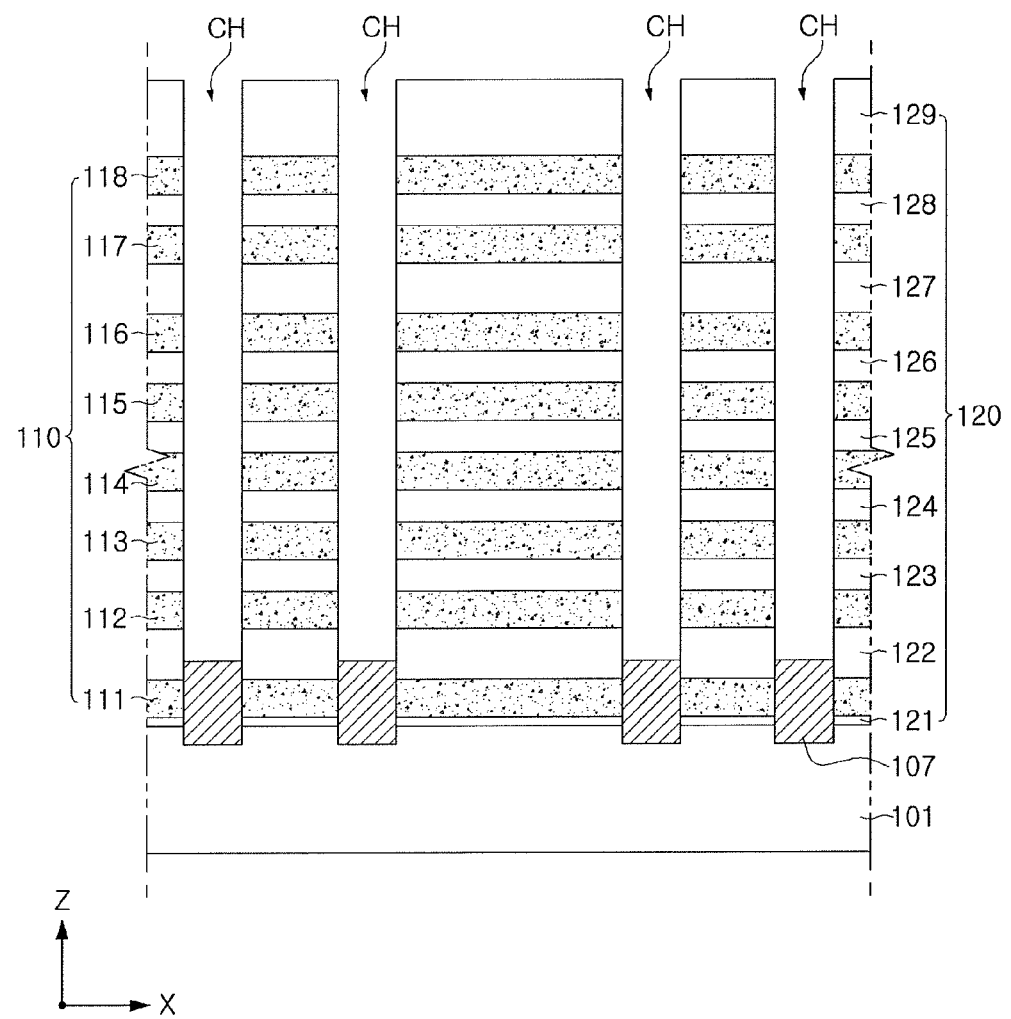

Referring to FIG. 8C, epitaxial layers 107 may be formed on recessed portions of the substrate 101.

The epitaxial layers 107 may be grown from the substrate 101 by, for example, a selective epitaxial growth (SEG) process, and may be formed as a single layer or a plurality of layers. The epitaxial layers 107 may include, for example, doped or undoped polycrystalline silicon, single crystalline silicon, polycrystalline germanium, or single crystalline germanium. Upper surfaces of the epitaxial layers 107 may be higher than an upper surface of the sacrificial layer 111 to be replaced by the gate electrode 131 of the ground select transistor GST (please refer to FIG. 2).

Figure 8D:
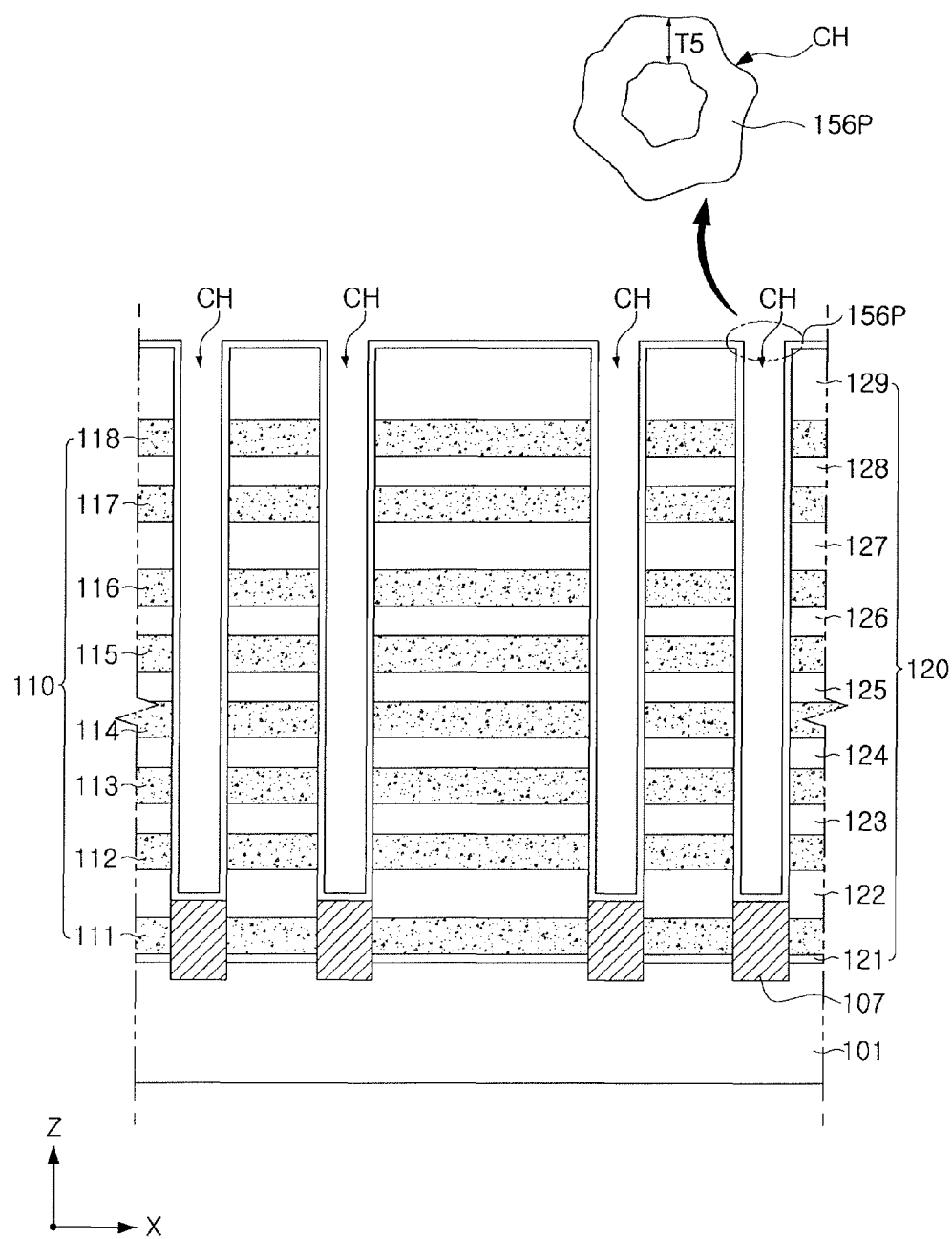

Referring to FIG. 8D, a preliminary blocking layer 156P may be formed in the channel holes CH.

The preliminary blocking layer 156P may form a blocking layer 156 in a subsequent process, and may be formed by, for example, an atomic layer deposition (ALD) method or a chemical vapor deposition (CVD) method. In another implementation, the preliminary blocking layer 156P may be formed by deposition or oxidation. For example, the preliminary blocking layer 156P may be formed by depositing a silicon compound and oxidizing the silicon compound.

As illustrated in a cross-section in the x-y plane of FIG. 8D, the preliminary blocking layer 156P may be formed to have a fifth thickness T5 in the irregular shaped channel hole CH. The fifth thickness T5 may be greater than a thickness of the final blocking layer 156. The preliminary blocking layer 156P may have a shape corresponding to the shape of the channel hole CH. In some example embodiments, the shape of the preliminary blocking layer 156P may have more irregularities than the shape of channel hole CH. Such a shape may be generated, for example, due to characteristics of an oxidation process when the preliminary blocking layer 156P is formed by the oxidation process, and thereby convex portions may further protrude and concave portions may further be deepened. Here, a thickness of the preliminary blocking layer 156P may be locally changed.

The preliminary blocking layer 156P may be conformally formed even in a corner connected to the epitaxial layers 107 disposed therebelow.

Figure 8E:
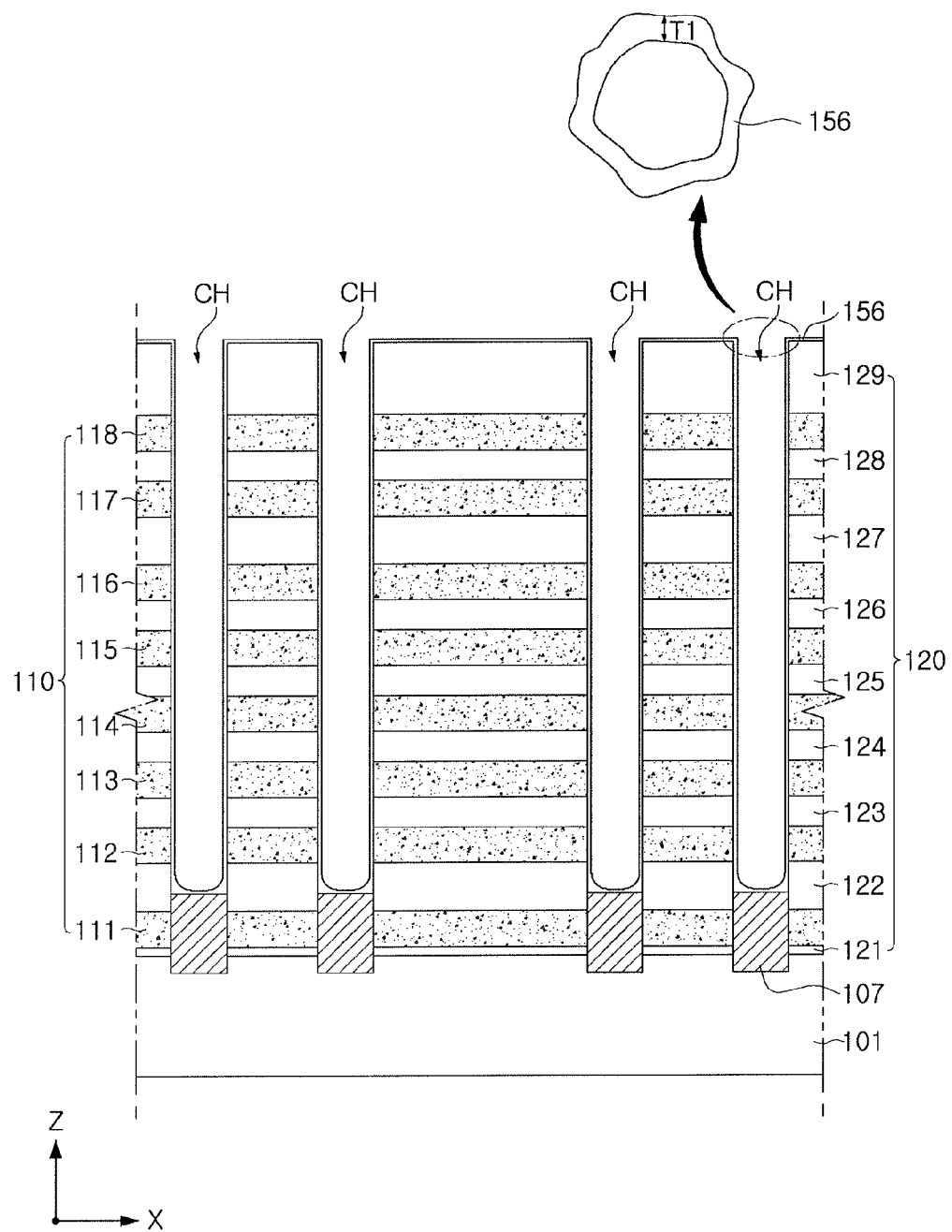

Referring to FIG. 8E, the blocking layer 156 may be formed by partially removing the preliminary blocking layer 156P.

The preliminary blocking layer 156P may be partially removed in a dry etching process or a wet etching process. For example, when the preliminary blocking layer 156P is formed of silicon oxide, the etching process may be performed using an etching solution including ammonia and hydrogen peroxide.

The etching process may be performed at a relatively low etching rate by controlling an etchant and/or process conditions, in order to control a thickness of the blocking layer 156. The blocking layer 156 may have a first thickness T1 smaller than the fifth thickness T5 of the preliminary blocking layer 156P. During the etching process, since relatively convex portions are affected by the etchant in various directions, an inner circumference of the blocking layer 156 may have relatively gentle convex portions compared to an outer circumference of the blocking layer 156. Accordingly, even when more layers are deposited in a subsequent process, irregularities in shape may not become severe.

The blocking layer 156 may have a gently curved surface in a lower corner thereof by the etching process. Accordingly, in the corner, while a side surface and a lower surface of an outer surface of the blocking layer 156 form a right angle, a side surface and a lower surface of an inner surface of the blocking layer 156 may form a gently curved surface. Accordingly, a thickness of the blocking layer 156 in the corner may be greater than a thickness of the blocking layer 156 on the sidewall of the channel hole CH and a thickness of the blocking layer 156 on the epitaxial layers 107.

In some example embodiments, when the blocking layer 156 is a multilayer structure, each of the layers configuring the blocking layer 156 may be deposited and partially etched, or one of the layers may be deposited and partially etched.

Figure 8F:
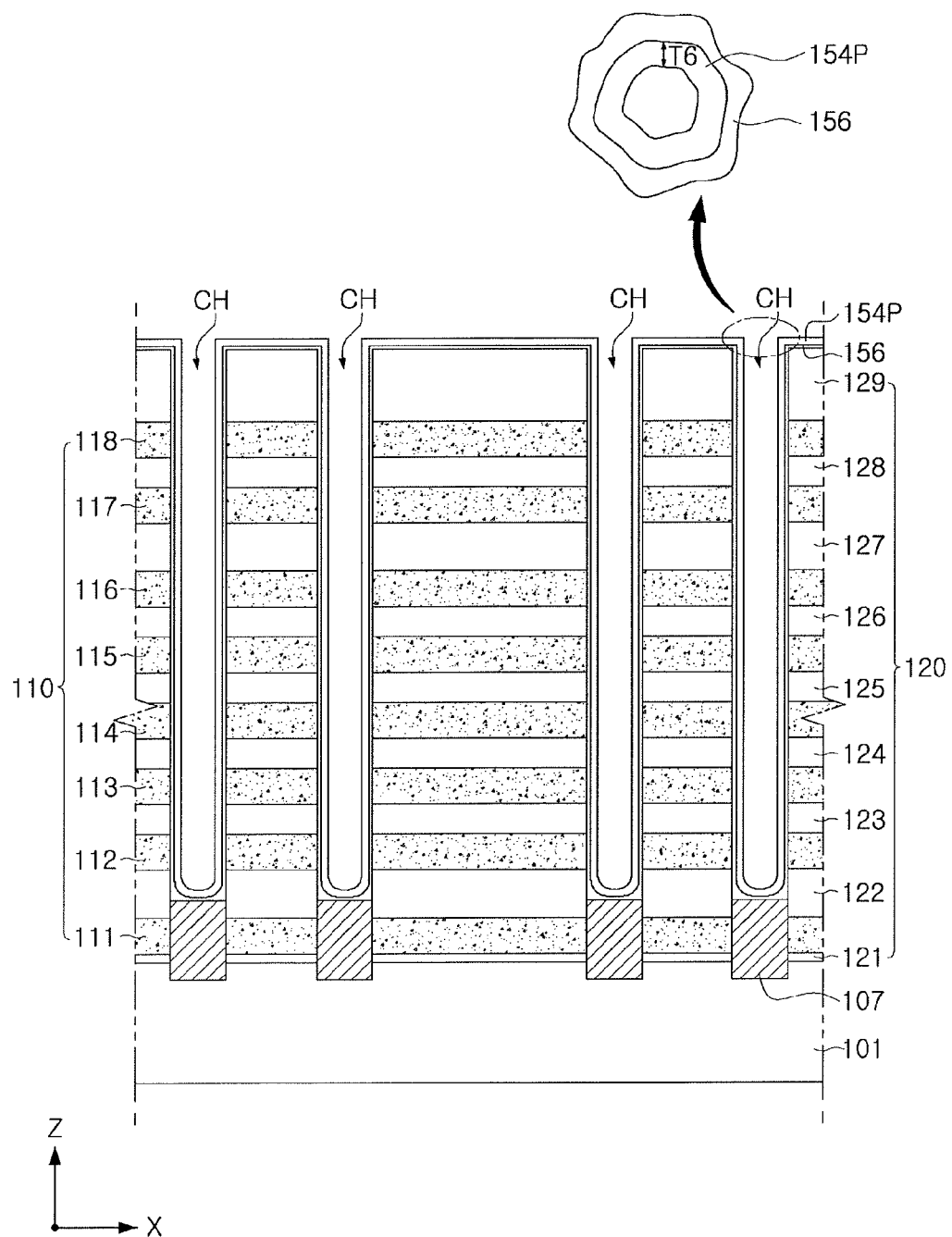

Referring to FIG. 8F, a preliminary charge storage layer 154P may be formed on the blocking layer 156.

The preliminary charge storage layer 154P may form a charge storage layer 154 in a subsequent process, and may have a uniform thickness by an ALD or CVD method. The preliminary charge storage layer 154P may have a sixth thickness T6 on the blocking layer 156. The sixth thickness T6 may be greater than a thickness of the final charge storage layer 154. The preliminary charge storage layer 154P is in contact with the inner circumference of the blocking layer 156. Thus, a shape of the preliminary charge storage layer 154P may correspond to the shape of the inner circumference of the blocking layer 156.

Figure 8G:
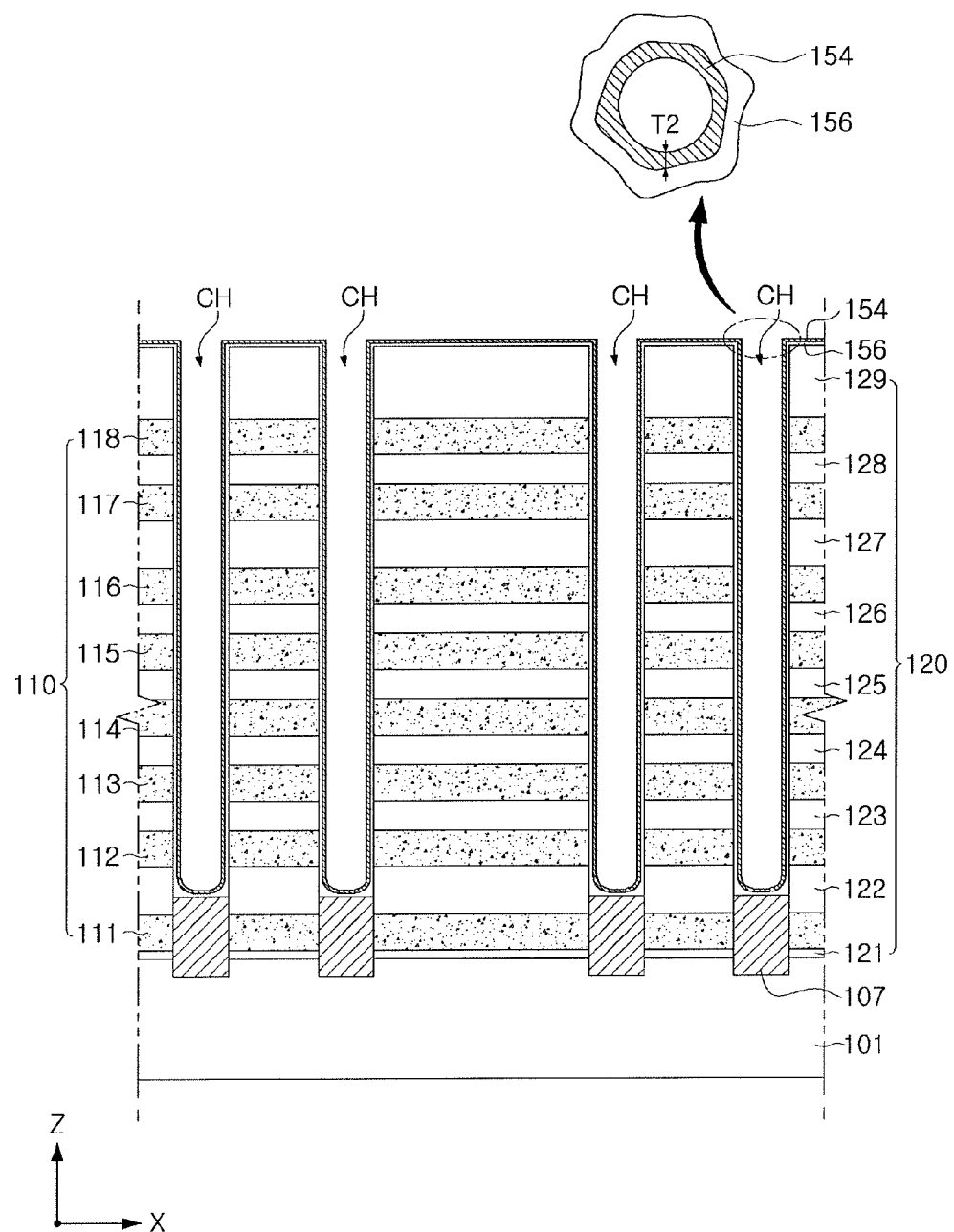

Referring to FIG. 8G, the preliminary charge storage layer 154P may be partially removed to form the charge storage layer 154.

The preliminary charge storage layer 154P may be partially removed using a wet etching process or a dry etching process. For example, when the preliminary charge storage layer 154P is formed of silicon nitride, the etching process may be performed using an HF solution.

The etching process may be performed at a relatively low etching rate by controlling an etchant and/or process conditions, in order to control a thickness of the charge storage layer 154. The charge storage layer 154 may have a second thickness T2 smaller than the sixth thickness T6 of the preliminary charge storage layer 154P. During the etching process, since relatively convex portions are affected by the etchant in various directions, an inner circumference of the charge storage layer 154 may have more gentle convex portions than an outer circumference of the charge storage layer 154. The charge storage layer 154 may have a more gently curved surface in a lower corner thereof.

Figure 8H:
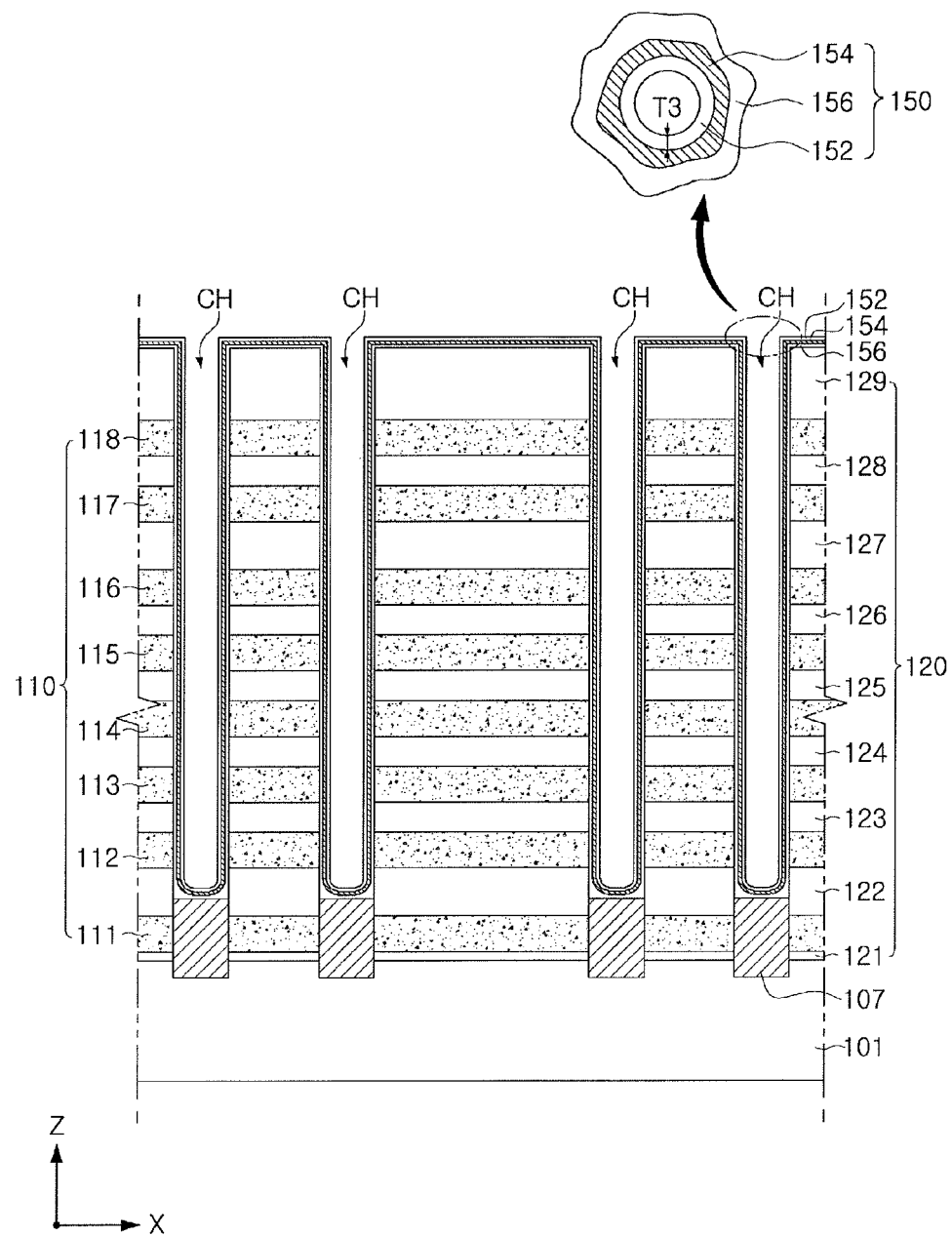

Referring to FIG. 8H, a tunneling layer 152 may be formed on the charge storage layer 154.

The tunneling layer 152 may be formed to have a third thickness T3 on the charge storage layer 154. The third thickness T3 may be, for example, the same as or smaller than the second thickness T2 of the charge storage layer 154.

The tunneling layer 152, like the charge storage layer 154 and the blocking layer 156, may be formed by forming a preliminary layer and partially removing the preliminary layer. In another example embodiment, the tunneling layer 152 may be formed only by a deposition process with no removal process.

As described above, a gate dielectric layer 150 including the tunneling layer 152, the charge storage layer 154, and the blocking layer 156 may be formed, and the gate dielectric layer 150 may have inner circumferences becoming more rounded sequentially to the blocking layer 156, the charge storage layer 154, and the tunneling layer 152.

Figure 8I:
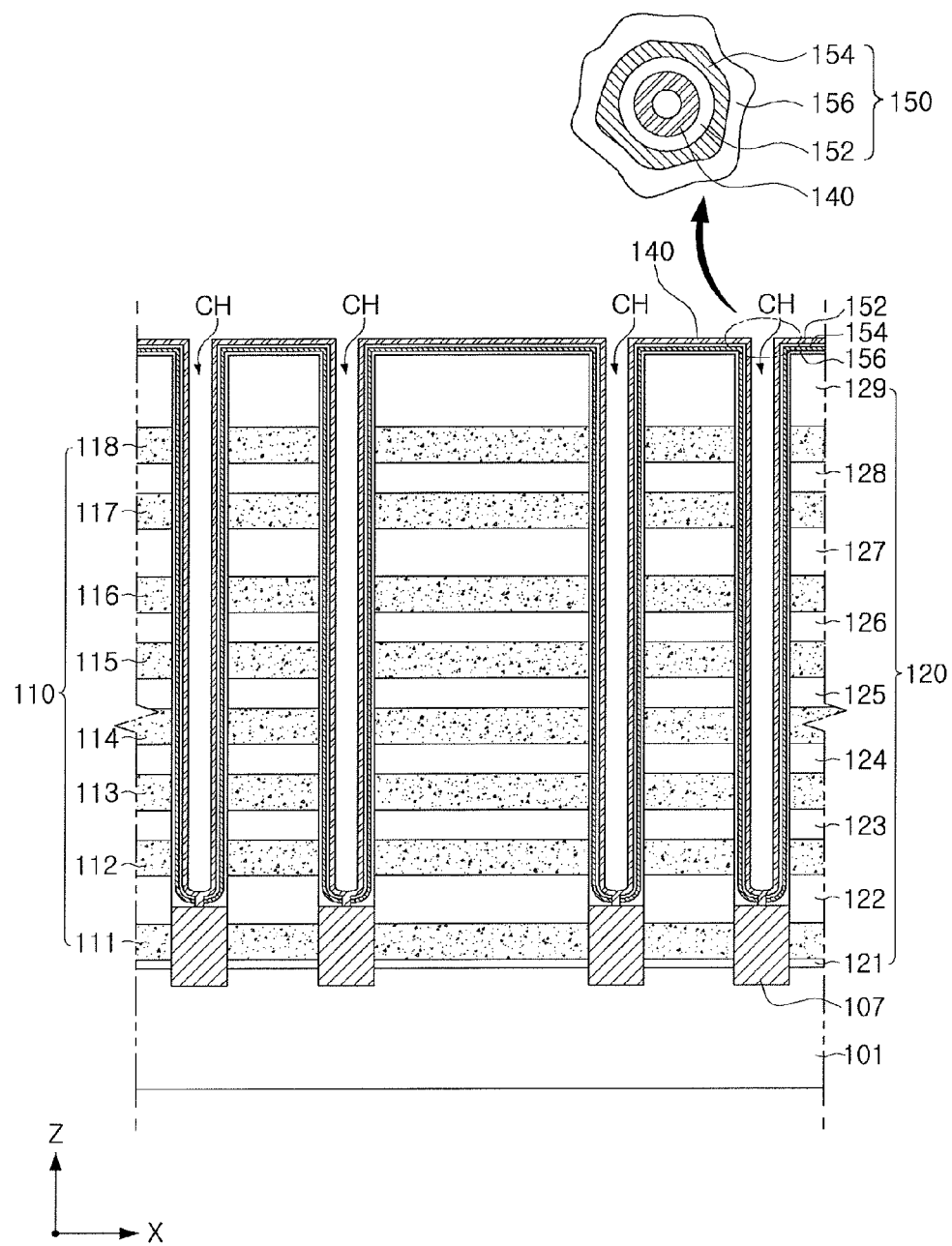

Referring to FIG. 8I, the gate dielectric layer 150 may be partially removed, and channel area 140 may be formed on the gate dielectric layer 150.

In order to form the channel area 140 to be in direct contact with the epitaxial layers 107, the gate dielectric layer 150 disposed on upper surfaces of the epitaxial layers 107 in the channel holes CH may be partially removed. For example, only the gate dielectric layer 150 formed on the upper surfaces of the epitaxial layers 107 may be selectively removed by forming an additional spacer layer and performing an etching process. A shape of an area in which the gate dielectric layer 150 is removed from the upper surfaces of the epitaxial layers 107 and a shape of an area in which the channel area 140 is connected to the epitaxial layers 107 may be variously changed according to example embodiments.

In the present example embodiment, the tunneling layer 152 disposed on an inner side of the dielectric layer 150 has greater circularity than a shape of a cross-sectional area of the channel hole CH. Thus, the channel area 140 formed on the tunneling layer 152 may also have a circular outer circumference and a circular inner circumference. In the channel hole CH, the gate dielectric layer 150 and the channel area 140 have relatively uniform shapes and thicknesses. Thus, failure occurrence during operation of the semiconductor device may be reduced or prevented, variations in electrical characteristics between the memory cells may be reduced, and operation characteristics such as programming voltages and programming speeds may be improved.

Figure 8J:
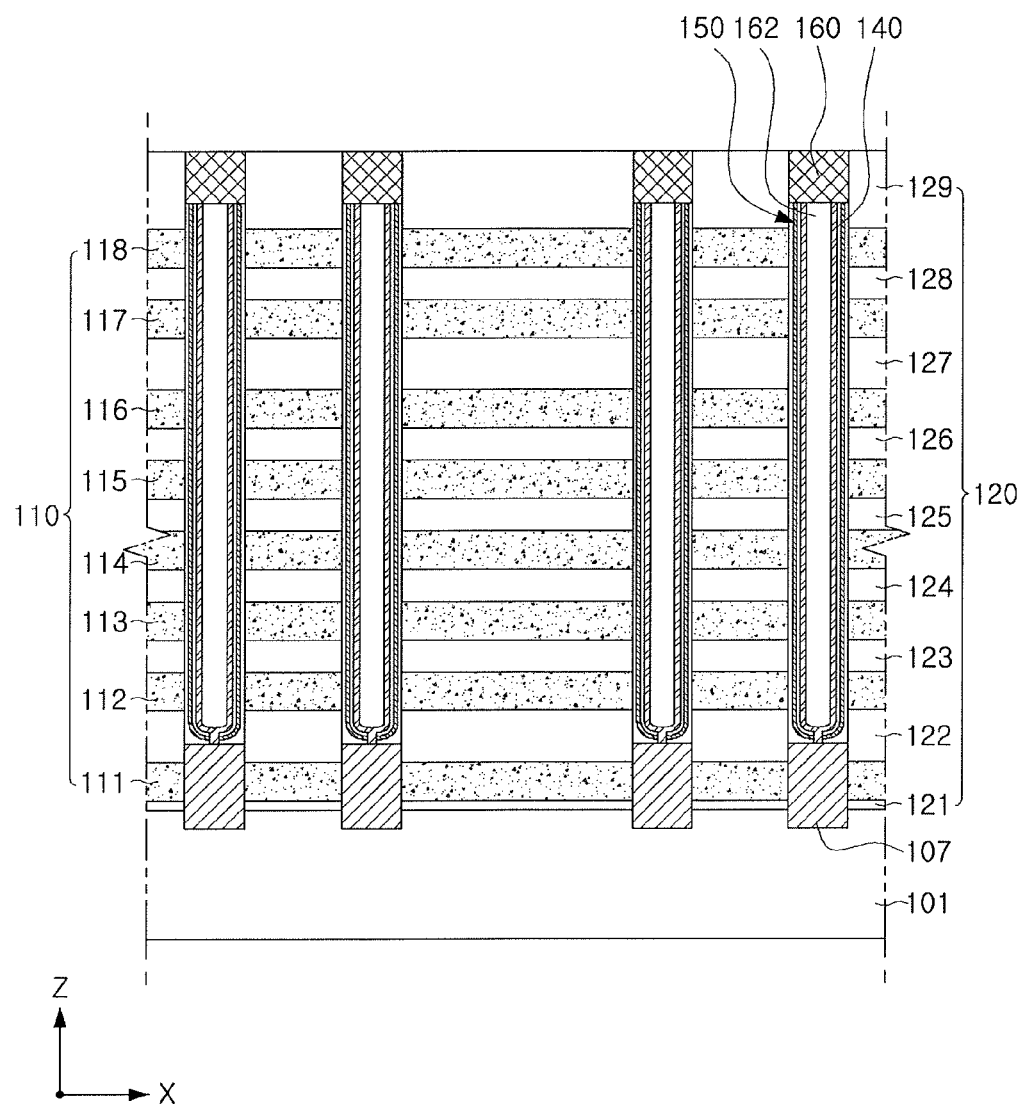

Referring to FIG. 8J, a first insulating layer 162 and a channel pad 160 may be formed in the channel hole CH.

The first insulating layer 162 may be formed to fill the channel holes CH, and may be formed of an insulating material. In another example embodiment, the channel holes CH may be filled not with the first insulating layer 162 but with a conductive material.

The channel pad 160 may be formed of a conductive material. The channel pad 160 may be electrically connected to the channel area 140, and may electrically connect the channel area 140 to bit lines BL1 to BLm (please refer to FIG. 2).

Figure 8K:
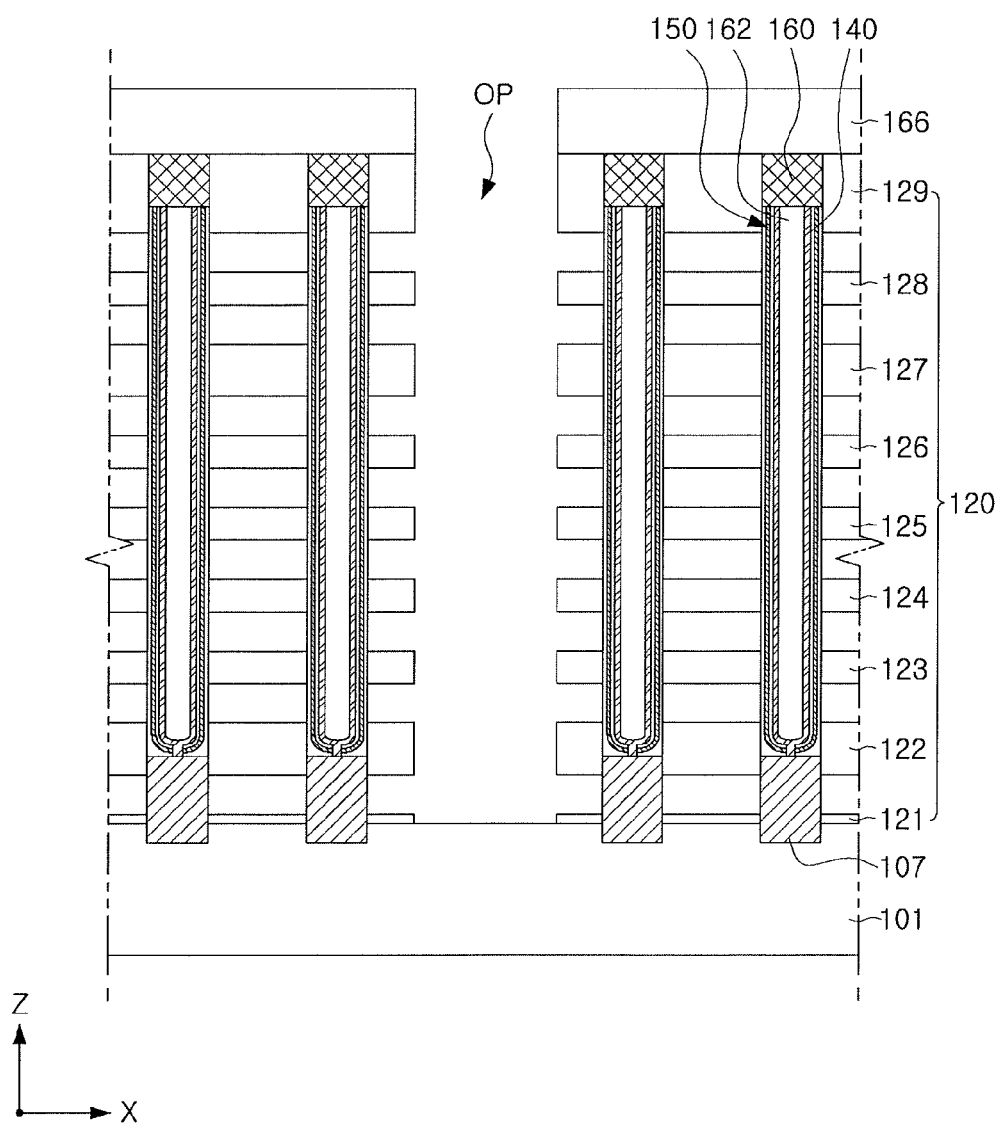

Referring to FIG. 8K, an opening OP dividing a stacked structure of the sacrificial layers 110 and the interlayer insulating layers 120 at a predetermined distance, and the sacrificial layers 110 exposed by the opening OP may be removed.

Before the opening OP is formed, a second insulating layer 166 may be additionally formed on the uppermost interlayer insulating layer 129 and the channel pad 160 so as to prevent damage of the channel pad 160 and the channel area 140 disposed therebelow.

The opening OP may be formed by forming a mask layer using a photolithography process and anisotropically etching the stacked structure of the sacrificial layers 110 and the interlayer insulating layers 120. The opening OP may be formed in the form of a trench extending in a y-direction (refer to FIG. 3). The opening OP may expose the substrate 101 between the channel areas 140. The sacrificial layers 110 may be removed in the etching process, and thereby a plurality of side openings may be formed between the interlayer insulating layers 120. Sidewalls of the gate dielectric layer 150 may be partially exposed through the side openings.

Figure 8L:
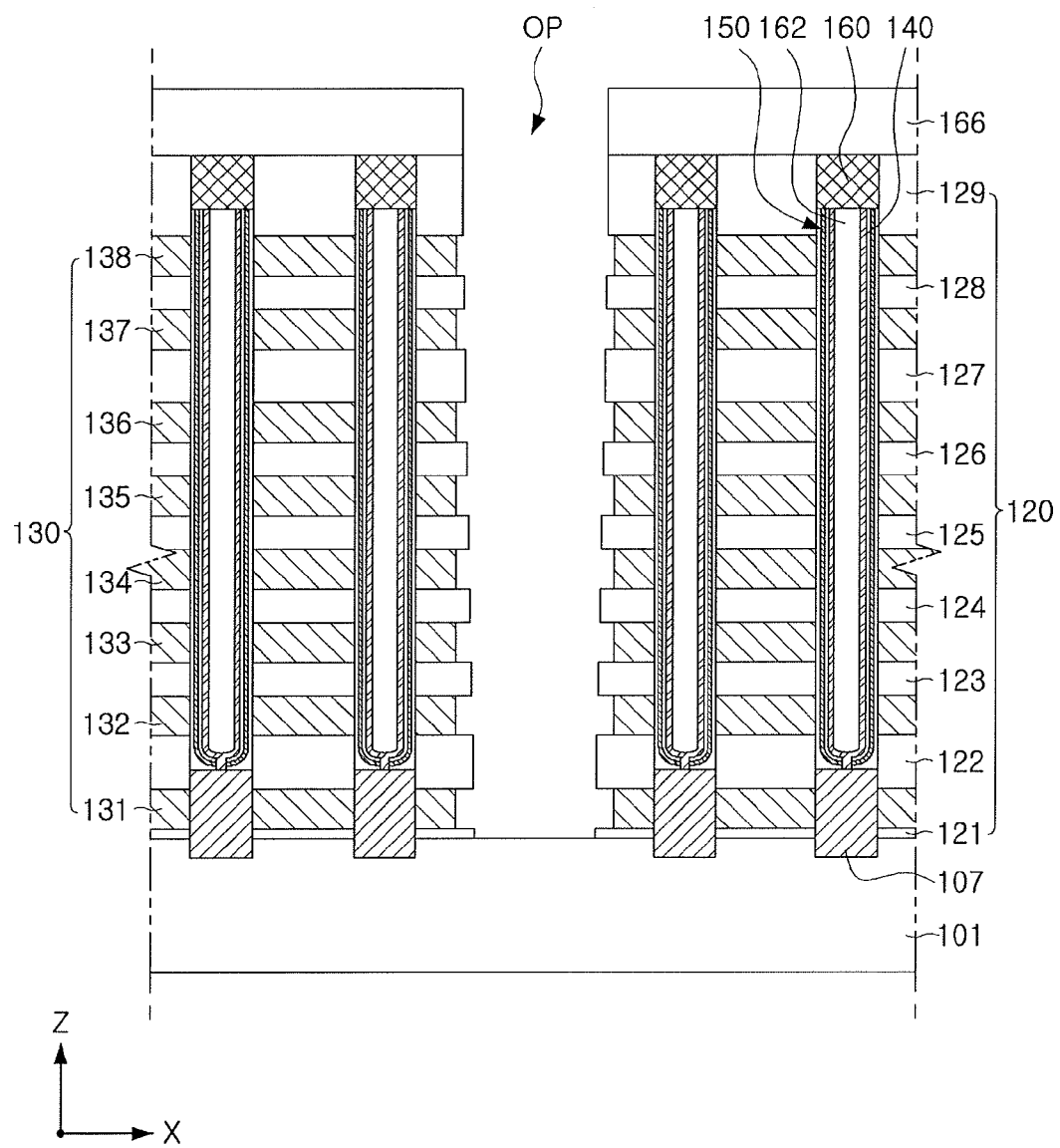

Referring to FIG. 8L, the gate electrodes 130 may be formed in the side openings from which the sacrificial layers 110 have been removed.

The gate electrodes 130 may include, for example, a metal, polycrystalline silicon, or a metal silicide material. The metal silicide material may be, for example, a silicide of a metal selected from Co, Ni, Hf, Pt, W, and Ti, or a combination thereof. When the gate electrodes 130 are formed of the metal silicide material, the gate electrodes 130 may be formed by filling the side openings with silicon (Si), forming an additional metal layer, and performing a silicidation process.

In the example embodiment described above with reference to FIG. 6, in this process, the second blocking layer 158 may be formed before the gate electrodes 130 are formed.

When the gate electrodes 130 are formed, a material configuring the gate electrodes 130 formed in the opening OP may be removed by performing an additional process so that the gate electrodes 130 are disposed only on the side openings. In an implementation, as illustrated in FIG. 8L, the interlayer insulating layers 120 may protrude more than the gate electrodes 130 toward the opening OP.

Figure 8M:
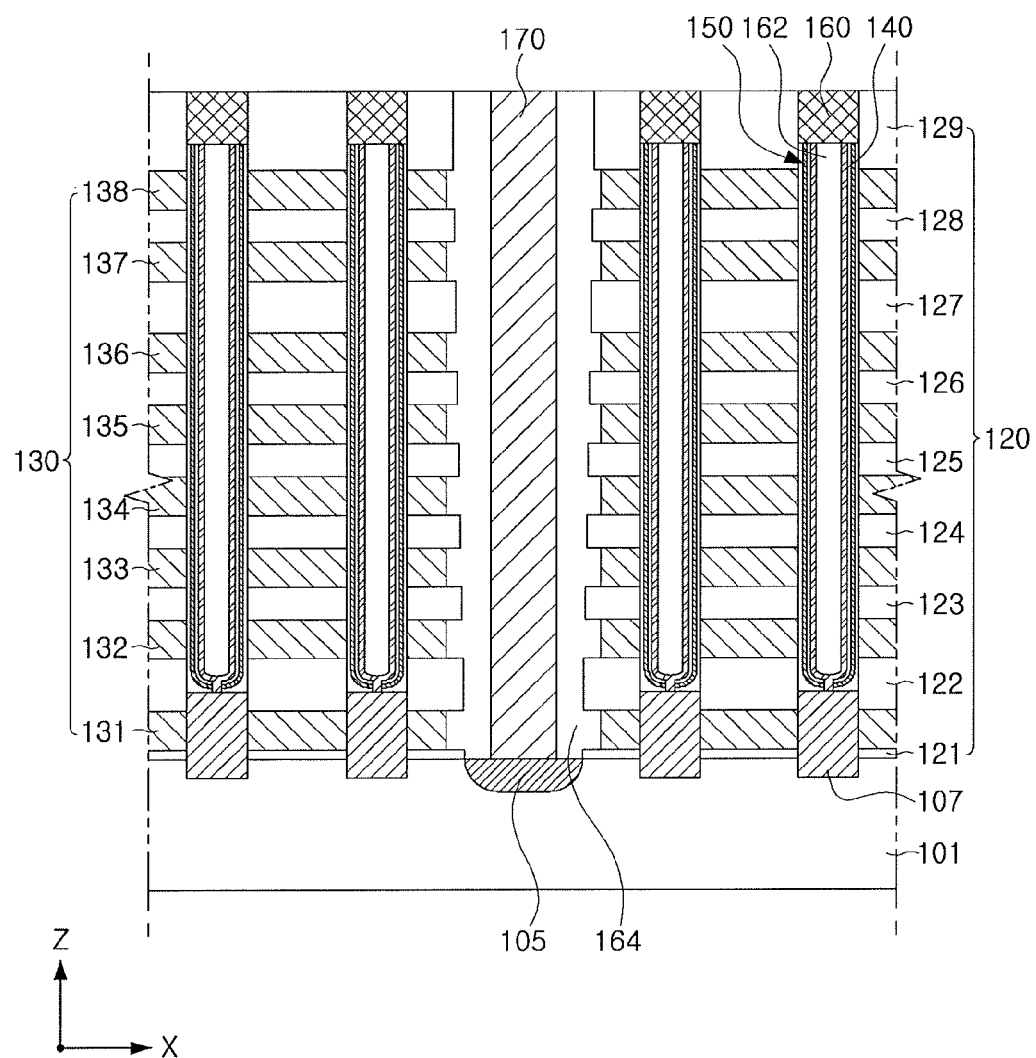

Referring to FIG. 8M, an impurity area 105 may be formed in the 101 the opening OP in the substrate 101, and a second insulating layer 164 and a conductive layer 170 are formed on the impurity area 105.

First, the impurity area 105 is formed by injecting impurities in the substrate 101 exposed by the opening OP. Next, a second insulating layer 164 may be formed on a sidewall of the opening OP. The second insulating layer 164 may be formed in a spacer shape by forming an insulating material and removing the insulating material to expose the upper surface of the substrate 101. In some example embodiments, the impurity area 105 may be formed after forming at least a portion of the second insulating layer 164. In some example embodiments, the second insulating layer 164 may be formed as a multilayer.

Next, the conductive layer 170 may be formed in an area defined by the second insulating layer 164. Before the conductive layer 170 is formed, a diffusion barrier layer may further be formed on the second insulating layer 164. The diffusion barrier layer may include a nitride, such as, TiN or WN.

Next, interconnection structures, such as contact plugs and bit lines BL1 to BLm (please refer to FIG. 2), may be formed on the channel pads 160.

Figure 9:
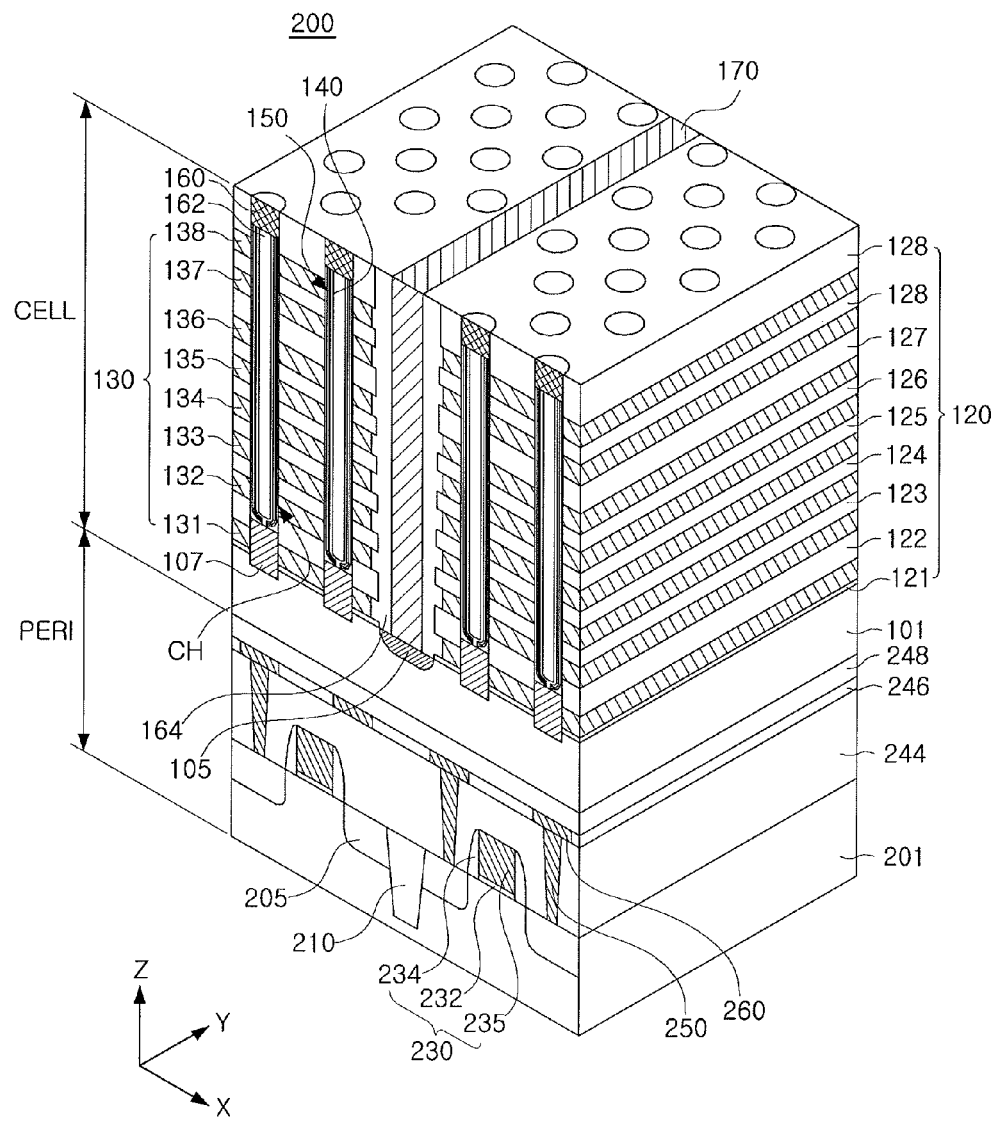
FIG. 9 illustrates a schematic perspective view of a semiconductor device according to an example embodiment.

FIG. 9 is a schematic perspective view illustrating a semiconductor device according to an example embodiment.

Referring to FIG. 9, a semiconductor device 200 may include a cell region CELL and a peripheral circuit region PERI.

The cell region CELL may correspond to a region in which the memory cell array 20 of FIG. 1 is disposed, and the peripheral circuit region PERI may correspond to a region in which the driving circuit 30 for the memory cell array 20 of FIG. 1 is disposed. The cell region CELL may be disposed on the peripheral circuit region PERI. In some example embodiments the cell region CELL may be disposed below the peripheral circuit region PERI.

In the cell region CELL, the semiconductor device 200 may include a substrate 101, channel holes CH extending perpendicularly to an upper surface of the substrate 101 and including channel areas 140 disposed therein, and a plurality of interlayer insulating layers 120 and a plurality of gate electrodes 130 formed on outer sidewalls of the channel holes CH. In addition, the semiconductor device 200 may further include a gate dielectric layer 150 disposed between the channel areas 140 and gate electrodes 130, epitaxial layers 107 disposed below the channel areas 140, channel pads 160 disposed on the channel holes CH, an impurity area 105 disposed in the substrate 101 between the gate electrodes 130, and a conductive layer 170 disposed on the impurity area 105.

In the present example embodiment, the cell region CELL is illustrated to have the same structure as those in the example embodiment illustrated in FIG. 3, but the cell region CELL may include, for example, various semiconductor devices according to various example embodiments, for example, as described with reference to FIGS. 5A to 6.

The peripheral circuit region PERI may include a base substrate 201, circuit devices 230 arranged on the base substrate 201, contact plugs 250, and interconnection lines 260.

The base substrate 201 may have an upper surface extending in an x-axis direction and a y-axis direction. The base substrate 201 may include a device isolation layer 210 and an active region defined by the device isolation layer 210. Doped areas 205 including impurities may be formed in portions of the active region. The base substrate 201 may include a semiconductor material such as a Group IV semiconductor, a Group III-V semiconductor compound, or a Group II-VI semiconductor.

The circuit devices 230 may include horizontal transistors. Each of the circuit devices 230 may include a circuit gate insulating layer 232, a spacer 234, and a circuit gate electrode 235. The doped areas 205 may be formed in the base substrate 201 at both sides of the circuit gate electrode 235, to function as a source area or a drain area of the circuit device 230.

A plurality of peripheral insulating layers 244, 246, and 248 may be formed on the circuit devices 230 on the base substrate 201.

The contact plugs 250 may be connected to the doped areas 205 through the peripheral insulating layers 244. Electrical signals may be applied to the circuit devices 230 through the contact plugs 250. The contact plugs 250 may be connected to the circuit gate electrode 235 in an area that is not illustrated in FIG. 9. The interconnection lines 260 may be connected to the contact plugs 250. In some example embodiments, the interconnection lines 260 may be formed in a plurality of layers.

After the peripheral circuit region PERI is formed, the substrate 101 of the cell region CELL may be formed thereon to form the cell region CELL. A size of the substrate 101 may be the same as or a smaller than a size of the base substrate 201. The substrate 101 may be formed of, for example, polycrystalline silicon. In another implementation, for example, the substrate 101 may be formed of amorphous silicon, and then crystallized.

The cell region CELL and the peripheral circuit region PERI may be connected. For example, end portions of the gate electrodes 130 in the y-axis direction may be electrically connected to the circuit devices 230.

Figure 10:
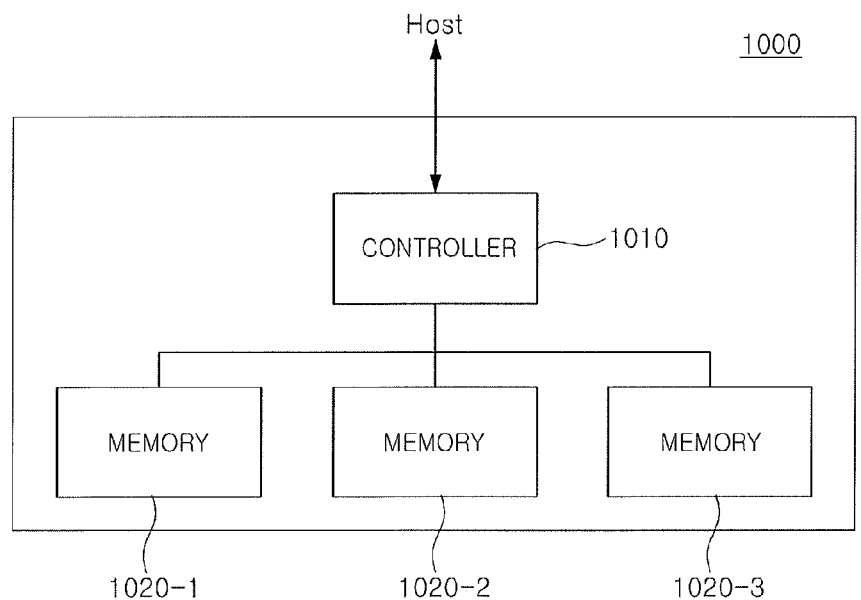
FIG. 10 illustrates a block diagram of a storage apparatus including a semiconductor device according to an example embodiment.

FIG. 10 is a block diagram illustrating a storage apparatus including a semiconductor device according to an example embodiment.

Referring to FIG. 10, a storage apparatus 1000 according to the present example embodiment may include a controller 1010 communicating with a host HOST, and memories 1020-1, 1020-2, and 1020-3 storing, for example, data. Each of the memories 1020-1, 1020-2, and 1020-3 may include the semiconductor devices according to various example embodiments, for example, as described above with reference to FIGS. 3 to 6.

The host HOST communicating with the controller 1010 may be a variety of electronic apparatuses in which the storage apparatus 1000 is installed, such as a smartphone, a digital camera, a desktop PC, a laptop computer, or a media player. The controller 1010 may receive a request for data reading or writing from the host HOST to generate a command CMD for writing data to the memories 1020-1, 1020-2, and 1020-3 or reading data from the memories 1020-1, 1020-2, and 1020-3.

As illustrated in FIG. 10, one or more memories 1020-1, 1020-2, and 1020-3 may be connected in parallel to the controller 1010 in the storage apparatus 1000. By connecting the plurality of memories 1020-1, 1020-2, and 1020-3 to the controller 1010 in parallel, the storage device 1000 having a large amount of capacity, such as a solid state drive (SSD), may be implemented.

Figure 11:
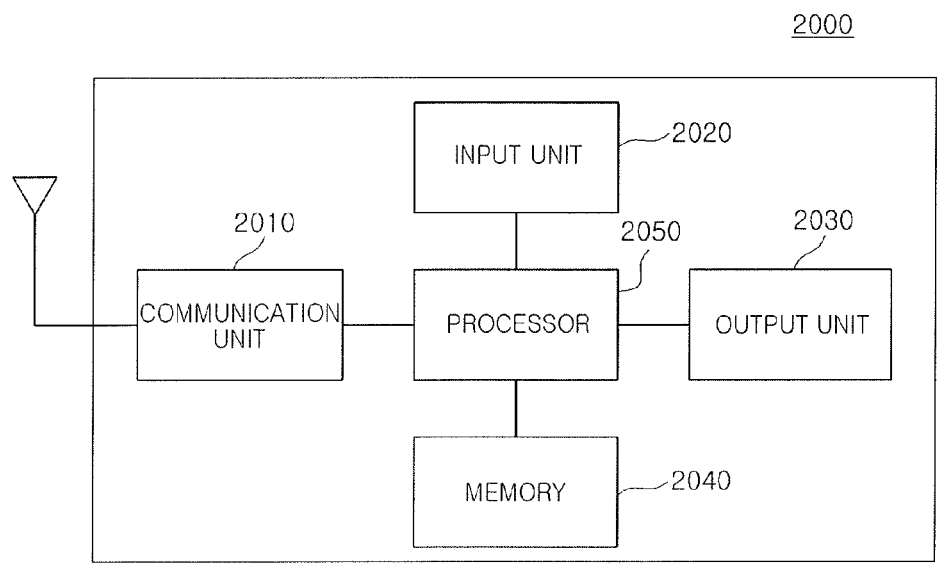
FIG. 11 illustrates a block diagram of an electronic apparatus including a semiconductor device according to an example embodiment.

FIG. 11 is a block diagram illustrating an electronic apparatus including a semiconductor device according to an example embodiment.

Referring to FIG. 11, an electronic apparatus 2000 according to the example embodiment may include a communication unit 2010, an input unit 2020, an output unit 2030, a memory 2040, and a processor 2050.

The communication unit 2010 may include a wired/wireless communications module, such as a wireless internet module, a short-range communications module, a GPS module, or a mobile communications module. The wired/wireless communications module included in the communication unit 2010 may be connected to an external communications network by a variety of communications standards in order to transmit and receive data.

The input unit 2020 is a module supplied to a user to control operations of the electronic apparatus 2000, and may include a mechanical switch, a touchscreen, a voice recognition module, or the like. In addition, the input unit 2020 may include a trackball, a laser pointer mouse, or a finger mouse, and may further include a variety of sensor modules in which a user can input data.

The output unit 2030 may output information processed by the electronic apparatus 2000 in tactile, audio, or video form. The memory 2040 may store a program for processing or controlling the processor 2050, data, or the like. The processor 2050 may write data or read data by transmitting a command to the memory 2040 according to a required operation.

The memory 2040 may be embedded in the electronic apparatus 2000 or may communicate with the processor 2050 via a separate interface. When the memory 2040 communicates with the processor 2050 via the separate interface, the processor 2050 may write data to, or read data from, the memory 2040 using a variety of interface standards, such as SD, SDHC, SDXC, MICRO SD, or USB.

The processor 2050 may control operations of each unit included in the electronic apparatus 2000. The processor 2050 may perform controlling or processing operations related to voice calls, video calls, or data communication, or may control or process operations for multimedia playback and management. In addition, the processor 2050 may process an input transmitted via the input unit 2020 from a user, and then output a result thereof via the output unit 2030. Further, the processor 2050 may write data, etc., to control operations of the electronic apparatus 2000 to the memory 2040, or read data, etc., from the memory 2040, as described above. One or more of the processor 2050 and the memory 2040 may include a semiconductor device according to an embodiment, for example, as described above with reference to FIGS. 3 to 6.

Figure 12:
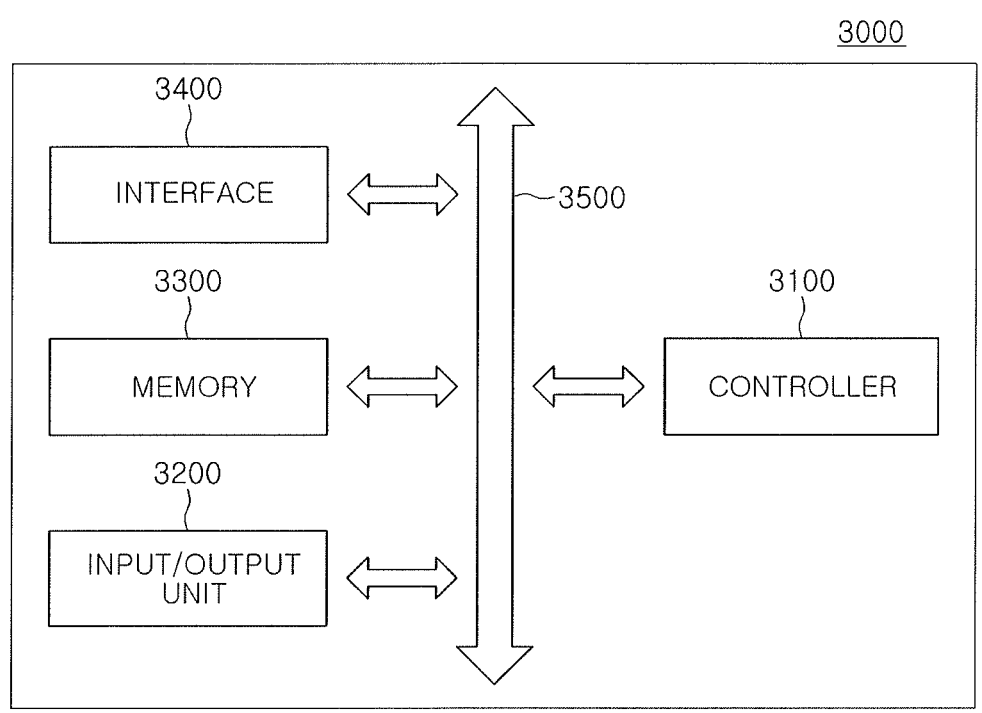
FIG. 12 illustrates a schematic diagram of a system including a semiconductor device according to an example embodiment.

FIG. 12 is a schematic diagram illustrating a system including a semiconductor device according to an example embodiment.

Referring to FIG. 12, a system 3000 may include a controller 3100, an input/output unit 3200, a memory 3300, and an interface 3400. The system 3000 may be, for example, a mobile system or an information transmitting or receiving system. The mobile system may be, for example, a PDA, a portable computer, a web tablet, a wireless phone, a mobile phone, a digital music player, or a memory card.

The controller 3100 may function to execute a program or control the system 3000. The controller 3100 may be, for example, a microprocessor, a digital signal processor, a microcontroller, or the like.

The input/output unit 3200 may be used to input data to the system 3000 or output data from the system 3000. The system 3000 may be connected to an external device, such as a PC or a network, through the input/output unit 3200 to exchange data with the external device. The input/output unit 3200 may be, for example, a touchscreen, a keypad, a keyboard, or a display.

The memory 3300 may store code and/or data for operating the controller 3100, and/or data processed in the controller 3100. The memory 3300 may include a semiconductor device according to an embodiment.

The interface 3400 may be a data transmission path between the system 3000 and an external device. The controller 3100, the input/output unit 3200, the memory 3300, and the interface 3400 may communicate through a bus 3500.

One or more of the controller 3100 and the memory 3300 may include a semiconductor device according to an embodiment, for example, as described above with reference to FIGS. 3 to 6.

As set forth above, embodiments may provide a semiconductor device having improved reliability by forming layers disposed in channel holes to have decreased variations in thicknesses and shapes.

The semiconductor device may be implemented as, for example, a vertical NAND (VNAND) flash memory.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   gate electrodes vertically stacked on a substrate; and
   channel holes passing through the gate electrodes to extend perpendicularly to the substrate and including a gate dielectric layer and a channel area, wherein:
   the gate dielectric layer is formed of a plurality of layers, the plurality of layers including a tunneling layer, a charge storage layer, and a blocking layer, sequentially disposed on the channel area, and
   at least two layers among the tunneling layer, the charge storage layer, and the blocking layer have different thicknesses in different locations.

2. The semiconductor device as claimed in claim 1, wherein, in at least one layer among the plurality of layers, variations in radius of curvature of an outer circumference is greater than variations in radius of curvature of an inner circumference.

3. The semiconductor device as claimed in claim 1, wherein each of the tunneling layer, the charge storage layer, and the blocking layer has an inner circumference having greater circularity than an outer circumference.

4. The semiconductor device as claimed in claim 1, wherein outer circumferences become more circular toward the tunneling layer from the blocking layer.

5. The semiconductor device as claimed in claim 1, wherein the gate dielectric layer further includes an additional blocking layer disposed outwardly of the blocking layer and having a shape corresponding to the channel hole.

6. The semiconductor device as claimed in claim 1, wherein at least one layer among the plurality of layers has a rounded corner formed by a side surface and a lower surface at a lower end of the channel area.

7. The semiconductor device as claimed in claim 6, wherein the outermost layer among the plurality of layers disposed outwardly of the channel hole includes a first surface facing outwardly from the channel hole and in which a side surface and a lower surface are perpendicularly connected, and a second surface facing inwardly from the channel hole and in which a side surface and a lower surface are roundedly connected.

8. The semiconductor device as claimed in claim 1, wherein a thickness of the channel area is substantially uniform along a circumference of the channel hole.

9. The semiconductor device as claimed in claim 1, wherein an inner circumference of the channel area has greater circularity than an outer circumference of the channel area.

10. The semiconductor device as claimed in claim 1, wherein each of the channel holes configure one memory cell string.

11. A semiconductor device, comprising:
gate electrodes vertically stacked on a substrate; and
channel holes passing through the gate electrodes to extend perpendicularly to the substrate, each of the channel holes including a plurality of layers,
wherein an outer circumference and an inner circumference of at least two layers among the plurality of layers have different shapes, and the inner circumference has greater circularity than the outer circumference.

12. The semiconductor device as claimed in claim 11, wherein the outer circumference and the inner circumference do not have shapes corresponding to each other.

13. The semiconductor device as claimed in claim 11, wherein variation in radius of curvature of the outer circumference is greater than variation in radius of curvature of the inner circumference.

14. The semiconductor device as claimed in claim 11, wherein the plurality of layers include a gate dielectric layer and a channel area.

15. A semiconductor device, comprising:
a substrate having a plurality of transistors stacked substantially vertically with respect to the substrate and sharing a single channel structure, the channel structure being oriented substantially vertically with respect to the substrate, the plurality of transistors including:
a plurality of gate electrodes;
a dielectric area that includes at least two insulating layers in contact with one another and extending through each of the plurality of gate electrodes, the dielectric area having an outer circumference and an inner circumference, the outer circumference of the dielectric area having a different shape than the inner circumference of the dielectric area, and the inner circumference of the dielectric area being only convex relative to a vertical axis of the channel structure; and
a channel area that extends through each of the plurality of gate electrodes, the channel area being surrounded by the dielectric area, an outer circumference of the channel area being only convex relative to the vertical axis.

16. The semiconductor device as claimed in claim 15, wherein the dielectric area includes a tunneling layer, a charge storage layer, and a blocking layer, an outer circumference of the blocking layer being proximate to a gate electrode of the plurality of gate electrodes.

17. The semiconductor device as claimed in claim 16, wherein the outer circumference of the blocking layer forms the outer circumference of the dielectric area, and the outer circumference of the blocking layer includes at least one concave portion and at least one convex portion relative to the vertical axis.

18. The semiconductor device as claimed in claim 17, wherein:
the channel area includes a semiconductor material having an outer circumference that is only convex relative to the vertical axis.

19. The semiconductor device as claimed in claim 17, wherein an inner circumference of the blocking layer has at least one concave portion and at least one convex portion relative to the vertical axis.

\* \* \* \* \*